(12) United States Patent
Ishida

(10) Patent No.: US 12,255,602 B2
(45) Date of Patent: Mar. 18, 2025

(54) FILTER AND MULTIPLEXER

(71) Applicant: TAIYO YUDEN CO., LTD., Tokyo (JP)

(72) Inventor: Mamoru Ishida, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 281 days.

(21) Appl. No.: 17/864,927

(22) Filed: Jul. 14, 2022

(65) Prior Publication Data

US 2023/0029646 A1 Feb. 2, 2023

(30) Foreign Application Priority Data

Jul. 27, 2021 (JP) .................. 2021-122250
Jul. 4, 2022 (JP) .................. 2022-107848

(51) Int. Cl.
*H03H 9/02* (2006.01)
*H03H 9/13* (2006.01)
*H03H 9/17* (2006.01)
*H03H 9/56* (2006.01)
*H03H 9/70* (2006.01)

(52) U.S. Cl.
CPC .......... *H03H 9/02015* (2013.01); *H03H 9/13* (2013.01); *H03H 9/17* (2013.01); *H03H 9/568* (2013.01); *H03H 9/703* (2013.01)

(58) Field of Classification Search
CPC ........ H03H 9/02015; H03H 9/13; H03H 9/17; H03H 9/568; H03H 9/703; H03H 9/02062; H03H 9/02157; H03H 9/564

USPC .......................................... 333/133, 186–188
See application file for complete search history.

(56) References Cited

U.S. PATENT DOCUMENTS

| 2004/0017269 | A1 | 1/2004 | Gotoh et al. |
| 2007/0210878 | A1 | 9/2007 | Yamaguchi et al. |
| 2017/0288644 | A1* | 10/2017 | Diep .................. H10N 30/40 |

FOREIGN PATENT DOCUMENTS

| JP | 2004-112757 A | 4/2004 |
| JP | 2008-42871 A | 2/2008 |
| JP | 2008-252159 A | 10/2008 |

* cited by examiner

*Primary Examiner* — Jorge L Salazar, Jr.
(74) *Attorney, Agent, or Firm* — CHEN YOSHIMURA LLP

(57) ABSTRACT

A filter includes a series resonator including a first piezoelectric layer and first electrodes, and a parallel resonator including a second piezoelectric layer and second electrodes. Each of the first and second piezoelectric layers is a monocrystalline lithium niobate layers, has an X-axis orientation in a planar direction, and has a thickness direction in a direction obtained by a 105° rotation of a +Z-axis orientation toward a +Y-axis orientation. The first electrodes face each other across the first piezoelectric layer to form a first resonance region and are extracted from the first resonance region in a direction substantially parallel to the X-axis orientation of the first piezoelectric layer. The second electrodes face each other across the second piezoelectric layer to form a second resonance region and are extracted from the second resonance region in a direction substantially orthogonal to the X-axis orientation of the second piezoelectric layer.

17 Claims, 17 Drawing Sheets

SERIES RESONATOR

PARALLEL RESONATOR

FILTER AND MULTIPLEXER

FIELD

A certain aspect of the present disclosure relates to a filter and a multiplexer.

BACKGROUND

Filters and duplexers in which piezoelectric thin film resonators are used have been known as filters and duplexers for high-frequency circuits of wireless terminals such as mobile phones. The piezoelectric thin film resonator includes a piezoelectric layer, and a pair of electrodes with the piezoelectric layer interposed therebetween. The region where the pair of electrodes are opposite to each other across the piezoelectric layer is a resonance region where the acoustic wave resonates. It has been known to use a lithium niobate layer, a lithium tantalate layer, or the like for the piezoelectric layer as disclosed in, for example, Japanese Patent Application Publication Nos. 2008-42871, 2008-252159, and 2004-112757.

RELATED ART DOCUMENTS

Patent Documents

Japanese Patent Application Publication No. 2008-42871
Japanese Patent Application Publication No. 2008-252159
Japanese Patent Application Publication No. 2004-112757

SUMMARY

In the case that a monocrystalline piezoelectric substance such as lithium niobate, lithium tantalate, crystal, or the like is used for the piezoelectric layer, the vibration in the resonance region may become the thickness-shear vibration. When the filter is formed using the piezoelectric thin film resonator having the thickness-shear vibration for the series resonator and the parallel resonator, there is room for improvement in improving the transmission characteristics.

The present disclosure has been made in view of above problems, and has an objective of improving transmission characteristics.

The present disclosure provides, in one aspect, a filter including: a substrate; a series resonator that is disposed on the substrate, is connected in series between an input terminal and an output terminal, and includes a first piezoelectric layer and a pair of first electrodes, the first piezoelectric layer being a monocrystalline lithium niobate layer or a monocrystalline lithium tantalate layer, an X-axis orientation of crystal orientations of the first piezoelectric layer corresponding to a planar direction, a thickness direction of the first piezoelectric layer corresponding to a direction obtained by rotating a +Z-axis orientation of the crystal orientations of the first piezoelectric layer substantially 105° toward the +Y-axis orientation, the pair of first electrodes being opposite to each other across the first piezoelectric layer to form a first resonance region, each of the pair of first electrodes being extracted from the first resonance region in a direction that is substantially parallel to the X-axis orientation of the crystal orientations of the first piezoelectric layer; and a parallel resonator that is disposed on the substrate, is connected in parallel between the input terminal and the output terminal, and includes a second piezoelectric layer and a pair of second electrodes, the second piezoelectric layer being a monocrystalline lithium niobate layer or a monocrystalline lithium tantalate layer, an X-axis orientation of crystal orientations of the second piezoelectric layer corresponding to a planar direction, a thickness direction of the second piezoelectric layer corresponding to a direction obtained by rotating a +Z-axis orientation of the crystal orientations of the second piezoelectric layer substantially 105° toward a +Y-axis orientation of the crystal orientations of the second piezoelectric layer, the pair of second electrodes being opposite to each other across the second piezoelectric layer to form a second resonance region, each of the pair of second electrodes being extracted from the second resonance region in a direction that is substantially orthogonal to the X-axis orientation of the crystal orientations of the second piezoelectric layer.

The present disclosure provides, in another aspect, a filter including: a substrate; a series resonator that is disposed on the substrate, is connected in series between an input terminal and an output terminal, and includes a first piezoelectric layer and a pair of first electrodes, the first piezoelectric layer being a monocrystalline lithium tantalate layer, an X-axis orientation of crystal orientations of the first piezoelectric layer being a thickness direction of the first piezoelectric layer, a Y-axis orientation and a Z-axis orientation of the crystal orientations of the first piezoelectric layer being planar directions, the pair of first electrodes being opposite to each other across the first piezoelectric layer to form a first resonance region, each of the pair of first electrodes being extracted from the first resonance region in a direction that is substantially orthogonal to a direction obtained by rotating the +Y-axis orientation of the crystal orientations of the first piezoelectric layer 42° toward the −Z-axis orientation; and a parallel resonator that is disposed on the substrate, is connected in parallel between the input terminal and the output terminal, and includes a second piezoelectric layer and a pair of second electrodes, the second piezoelectric layer being a monocrystalline lithium tantalate layer, an X-axis orientation of crystal orientations of the second piezoelectric layer being a thickness direction of the second piezoelectric layer, a Y-axis orientation and a Z-axis orientation of the crystal orientations of the second piezoelectric layer being planar directions, the pair of second electrodes being opposite to each other across the second piezoelectric layer to form a second resonance region, each of the pair of second electrodes being extracted from the second resonance region in a direction that is substantially parallel to a direction obtained by rotating the +Y-axis orientation of the crystal orientations of the second piezoelectric layer 42° toward the −Z-axis orientation of the crystal orientations of the second piezoelectric layer.

The present disclosure provides, in another aspect, a filter including: a substrate; a series resonator that is disposed on the substrate, is connected in series between an input terminal and an output terminal, and includes a first piezoelectric layer and a pair of first electrodes, the pair of first electrodes being opposite to each other across the first piezoelectric layer to form a first resonance region, the pair of first electrodes exciting thickness-shear vibration in the first piezoelectric layer, each of the pair of first electrodes being extracted from the first resonance region in a direction that is substantially orthogonal to a vibration direction of the thickness-shear vibration excited in the first piezoelectric layer; and a parallel resonator that is disposed on the substrate, is connected between the input terminal and the output terminal, and includes a second piezoelectric layer and a pair of second electrodes, the pair of second electrodes being opposite to each other across the second piezoelectric layer to form a second resonance region, the pair of second electrodes exciting thickness-shear vibration in the second piezoelectric layer, each of the pair of second electrodes being extracted from the second resonance region in a direction that is substantially parallel to a vibration direction of the thickness-shear vibration excited in the second piezoelectric layer.

In the above filter, each of the pair of first electrodes may be linearly extracted from the first resonance region in said direction by a length equal to or greater than 0.75 times a thickness of the first piezoelectric layer in the first resonance region, and each of the pair of second electrodes may be linearly extracted from the second resonance region in said direction by a length equal to or greater than 0.75 times a thickness of the second piezoelectric layer in the second resonance region.

The above filter may further include: a first wiring line coupled to an end opposite from the first resonance region of one of the pair of first electrodes; and a second wiring line coupled to an end opposite from the second resonance region of one of the pair of second electrodes, and a width of the first wiring line may vary with distance from the one of the pair of first electrodes and/or a width of the second wiring line may vary with distance from the one of the pair of second electrodes.

In the above filter, the series resonator may be provided in a plurality, connected in series between the input terminal and the output terminal, and the plurality of the series resonators are arranged such that the crystal orientations of the first piezoelectric layers of the plurality of the series resonator are the same, the series resonators may be arranged side by side substantially in parallel with a direction parallel to the X-axis orientation of the crystal orientations of the first piezoelectric layer, and a first series resonator of the series resonators may be coupled to the input terminal by the first wiring line a width of which increases at farther distances from the one of the pair of first electrodes to which the first wiring line is coupled, and a last series resonator of the series resonators may be coupled to the output terminal by the first wiring line a width of which increases at farther distances from the one of the pair of first electrodes to which the first wiring line is coupled.

In the above filter, the parallel resonator may be coupled to the first wiring line by the second wiring line a width of which decreases at farther distances from the pair of second electrodes.

The above filter may further include: a first wiring line coupled to an end opposite from the first resonance region of one of the pair of first electrodes; and a second wiring line coupled to an end opposite from the second resonance region of one of the pair of second electrodes, and the first wiring line may extend from the one of the pair of first electrodes in a direction intersecting with the direction in which the one of the pair of first electrodes is extracted from the first resonance region, and/or the second wiring line may extend from the one of the pair of second electrodes in a direction intersecting with the direction in which the one of the pair of second electrodes is extracted from the second resonance region.

In the above filter, the series resonator may be provided in a plurality, connected in series between the input terminal and the output terminal, and the plurality of the series resonators are arranged such that the crystal orientations of the first piezoelectric layers of the plurality of the series resonator are the same, the series resonators may be arranged side by side substantially in parallel with a direction orthogonal to the X-axis orientation of the crystal orientations of the first piezoelectric layer, a first series resonator of the series resonators may be coupled to the input terminal by the first wiring line that extends from the one of the pair of first electrodes in a direction intersecting with the direction in which the one of the pair of first electrodes is extracted from the first resonance region in the first series resonator, and a last series resonator of the series resonators may be coupled to the output terminal by the first wiring line that extends from the one of the pair of first electrodes in a direction intersecting with the direction in which the one of the pair of first electrodes is extracted from the first resonance region in the last series resonator, and the parallel resonator may be coupled to a ground terminal by the second wiring line that extends from the one of the pair of second electrodes in a direction intersecting with the direction in which the one of the pair of second electrodes is extracted from the second resonance region.

In the above filter, the first piezoelectric layer and the second piezoelectric layer may be formed of a single continuous piezoelectric layer.

The present disclosure provides, in another aspect, a multiplexer including the above filter.

BRIEF DESCRIPTION OF THE DRAWINGS

16B is a perspective view of a parallel resonator in the filter in accordance with the second embodiment.

DETAILED DESCRIPTION

Hereinafter, a description will be given of embodiments of the present disclosure with reference to the accompanying drawings.

First Embodiment

Figure 1A:
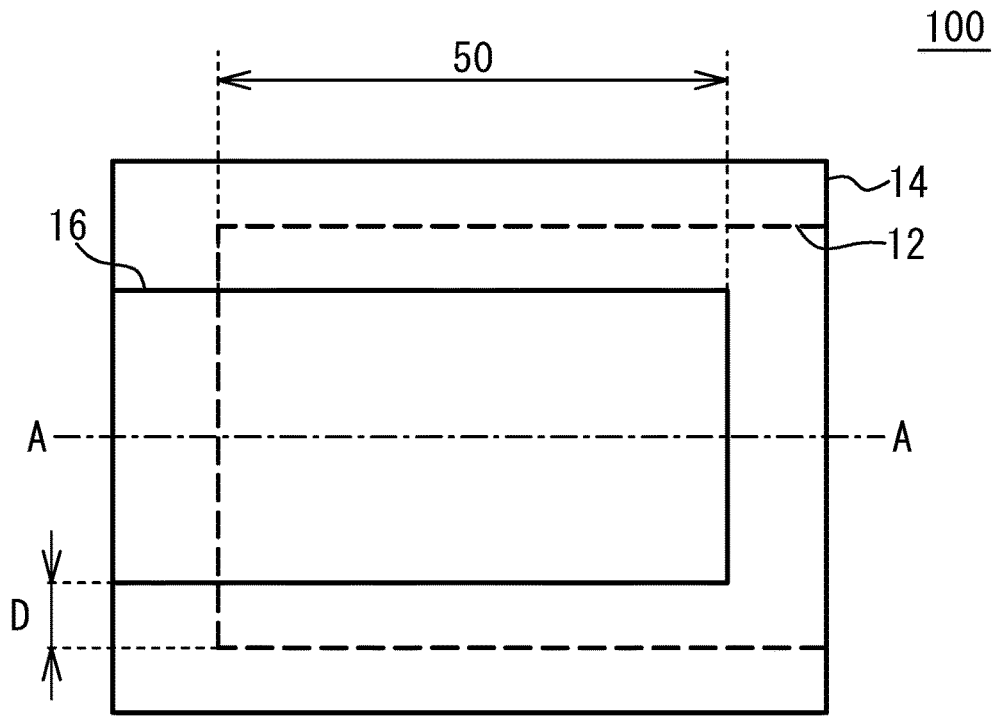
FIG. 1A is a plan view of a piezoelectric thin film resonator used in a filter in accordance with a first embodiment.
Figure 1B:
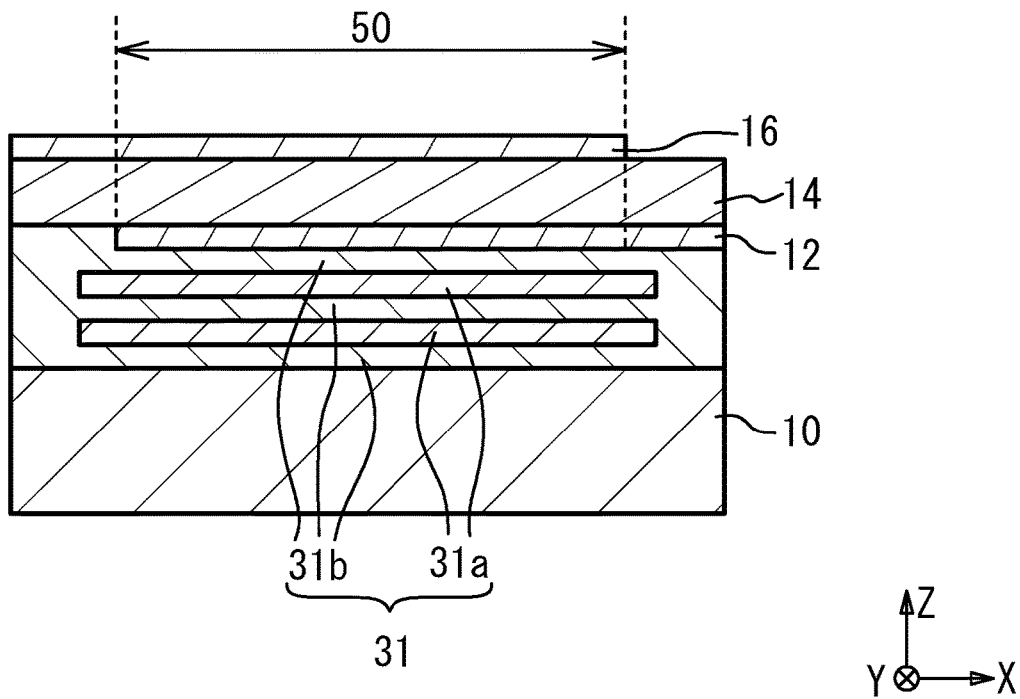
FIG. 1B is a cross-sectional view taken along line A-A in FIG. 1A.

FIG. 1A is a plan view of a piezoelectric thin film resonator 100 used in a filter in accordance with a first embodiment, and FIG. 1B is a cross-sectional view taken along line A-A in FIG. 1A. As illustrated in FIG. 1A and FIG. 1B, in the piezoelectric thin film resonator 100, an acoustic mirror 31 is provided over a substrate 10, and a piezoelectric layer 14 is provided over the acoustic mirror 31. The top and bottom surfaces of the piezoelectric layer 14 are substantially flat. A lower electrode 12 is provided under the piezoelectric layer 14, and an upper electrode 16 is provided on the piezoelectric layer 14. The region where the lower electrode 12 and the upper electrode 16 overlap across at least a part of the piezoelectric layer 14 in a plan view is a resonance region 50.

When high frequency power is applied between the lower electrode 12 and the upper electrode 16, the acoustic wave having a displacement in a substantially orthogonal direction to the Z direction (i.e., the strain direction with respect to the thickness) is excited in the piezoelectric layer 14 within the resonance region 50. This vibration is referred to as thickness-shear vibration. The direction in which the displacement of the thickness-shear vibration is largest (the displacement direction of the thickness-shear vibration) is defined as the vibration direction of the thickness-shear vibration. The wavelength of the acoustic wave is approximately two times the thickness of the piezoelectric layer 14. The planar shape of the resonance region 50 is, for example, a substantially rectangular shape. The rectangle has four substantially straight sides. The four sides extend in the X direction and the Y direction.

The acoustic mirror 31 includes films 31b and films 31a that are alternately arranged. The film 31b has a low acoustic impedance, while the film 31a has a high acoustic impedance. The film thickness of each of the films 31a and 31b is, for example, substantially $\lambda/4$ ($\lambda$ is the wavelength of the acoustic wave). Because of this structure, the acoustic mirror 31 reflects the acoustic wave. The number of the films 31a and 31b that are stacked is freely selected. The acoustic mirror 31 is only required to have a structure in which at least two layers with different acoustic characteristics are stacked at an interval. The substrate 10 may be one of the two layers with different acoustic characteristics of the acoustic mirror 31. For example, the acoustic mirror 31 may have a structure in which one film having an acoustic impedance different from that of the substrate 10 is provided in the substrate 10. In a plan view, the acoustic mirror 31 overlaps with the resonance region 50, and the size of the acoustic mirror 31 is the same as or larger than the size of the resonance region 50.

The substrate 10 is, for example, a silicon substrate, a sapphire substrate, an alumina substrate, a spinel substrate, a quartz substrate, a crystal substrate, a glass substrate, a ceramic substrate, or a GaAs substrate. The piezoelectric layer 14 is, for example, a monocrystalline lithium niobate layer, a monocrystalline lithium tantalate layer, or a monocrystalline crystal. The first embodiment will describe the case that the piezoelectric layer 14 is a monocrystalline lithium niobate layer.

The lower electrode 12 and the upper electrode 16 are formed of a single-layer film of, for example, ruthenium (Ru), chrome (Cr), aluminum (Al), titanium (Ti), copper (Cu), molybdenum (Mo), tungsten (W), tantalum (Ta), platinum (Pt), rhodium (Rh), or iridium (Ir), or a multilayered film of at least two of them.

In the resonance region 50, a first additional film may be provided in at least one of the following locations: on the top surface of the lower electrode 12, on the bottom surface of the lower electrode 12, and in the lower electrode 12. Similarly, in the resonance region 50, the first additional film may be provided in at least one of the following locations: on the top surface of the upper electrode 16, the bottom surface of the upper electrode 16, and in the upper electrode 16. The first additional film is a metal film or insulating film having a smaller density than the lower electrode 12 and the upper electrode 16. Provision of the first additional film allows the electromechanical coupling coefficient to be adjusted without largely deteriorating the resonance characteristics.

In the edge regions located on both sides of the center region of the resonance region 50 in the X direction and/or the Y direction, a second additional film may be provided on the upper electrode 16 and/or under the lower electrode 12. The second additional film is not provided in the center region interposed between the edge regions of the resonance region 50. The second additional films provided in the respective edge regions located on both sides of the center region in the X direction extend in substantially the Y direction, and the width of the second additional film in the X direction is substantially uniform in the Y direction. Similarly, the second additional films provided in the respective edge regions located on both sides of the center region in the Y direction extend in substantially the X direction, and the width of the second additional film in the Y direction is substantially uniform in the X direction. The second additional film is one of metal films exemplified for the lower electrode 12 and the upper electrode 16, or an insulating film such as, but not limited to, a silicon oxide film, a silicon nitride film, an aluminum oxide film, a tantalum oxide film, or a niobium oxide film. Provision of the second additional film achieves the piston mode, reducing spurious emissions.

Simulation 1

Figure 2:
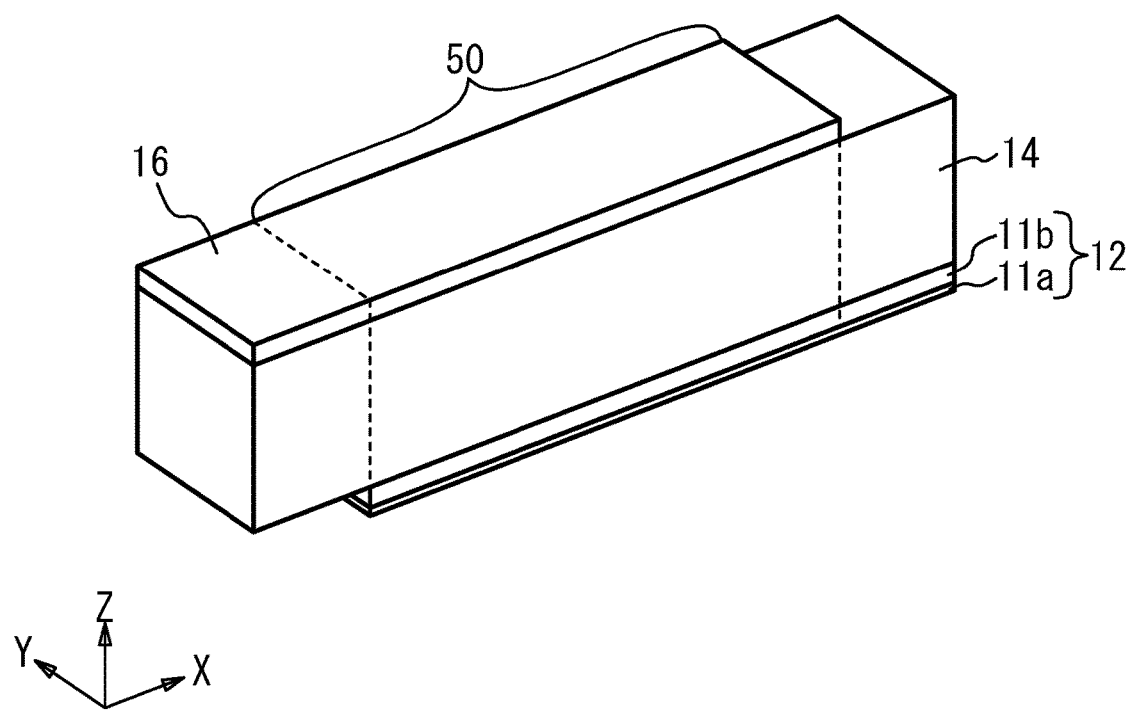
FIG. 2 is a perspective view of a model used in a simulation 1.

FIG. 2 is a perspective view of a model used in a simulation 1. As illustrated in FIG. 2, in the model used in the simulation 1, the piezoelectric layer 14 is provided on the lower electrode 12 having a lower layer 11a and an upper layer 11b, and the upper electrode 16 is provided on the piezoelectric layer 14. Simulation conditions are as follows.

Wavelength $\lambda$ of the acoustic wave: Two times the thickness of the piezoelectric layer 14

Lower layer 11a of the lower electrode 12: Chrome layer with a thickness of 18 nm Upper layer 11b of the lower electrode 12: Ruthenium layer with a thickness of 100 nm Piezoelectric layer 14: Lithium niobate layer with a thickness of 1300 nm Upper electrode 16: Ruthenium layer with a thickness of 100 nm Conditions in the X direction: Width of the resonance region 50 in the X direction is $30\lambda$.

Conditions in the Y direction: Width of the resonance region 50 in the Y direction is 0.5λ, and the boundary condition is continuous infinitely.

Figure 3A:
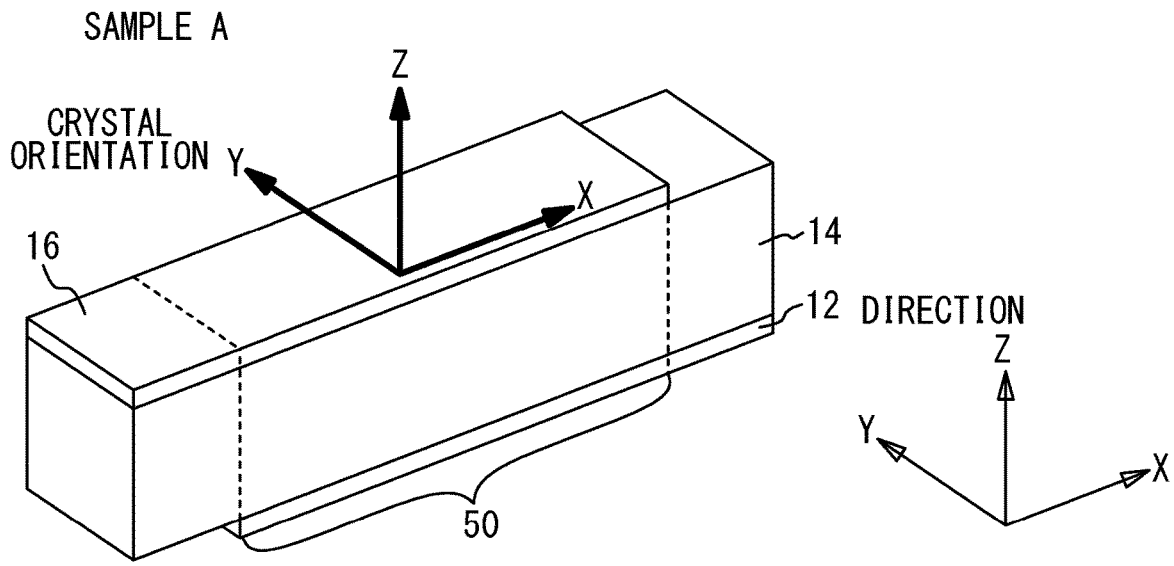
FIG. 3A to FIG. 3C are perspective views illustrating the crystal orientations of a piezoelectric layer in a sample A.
Figure 3B:
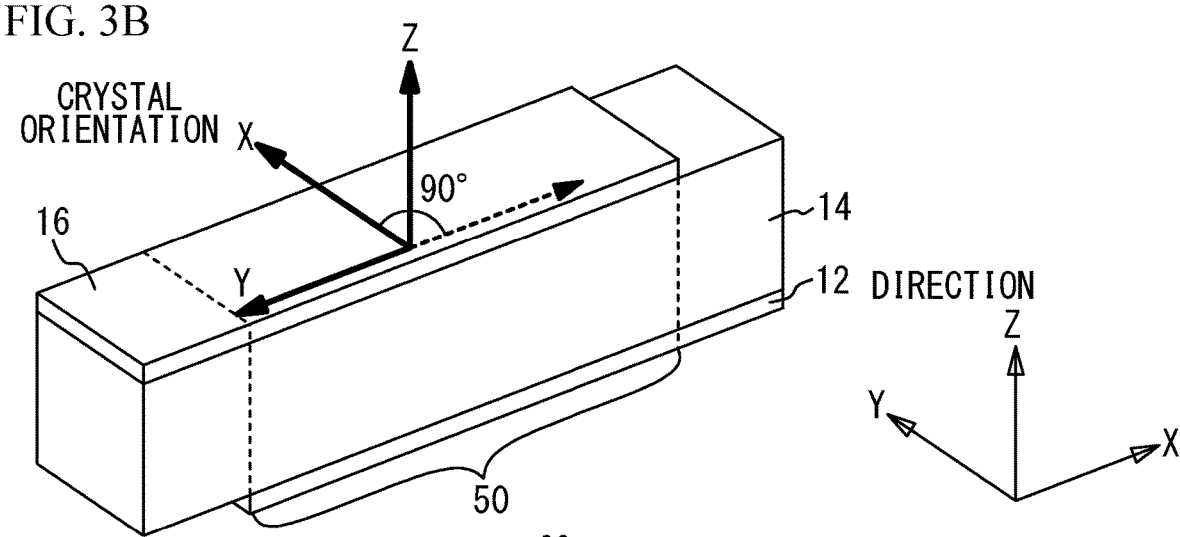
Figure 3C:
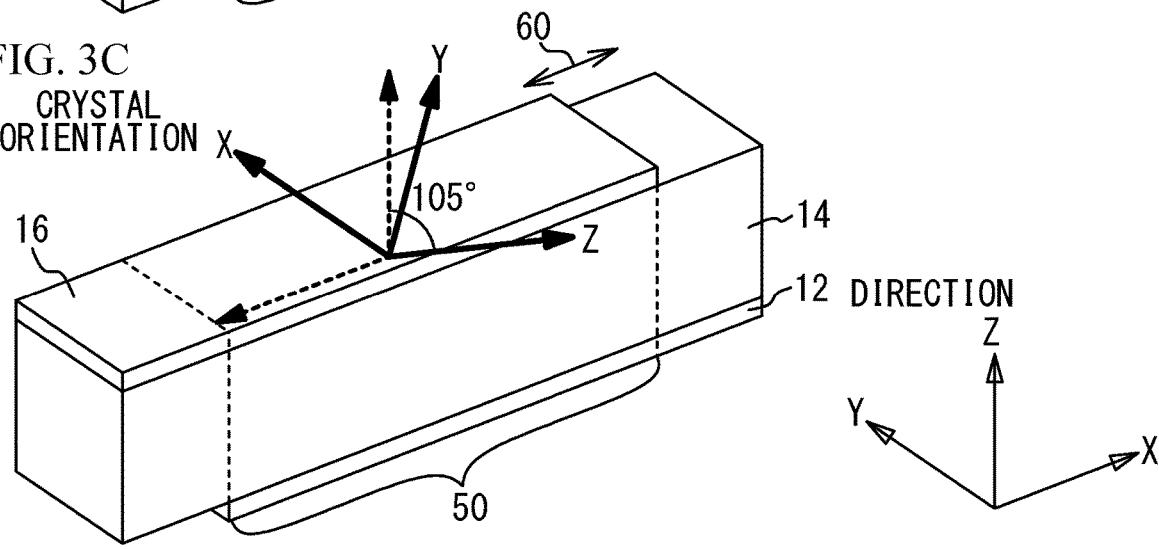
Figure 4A:
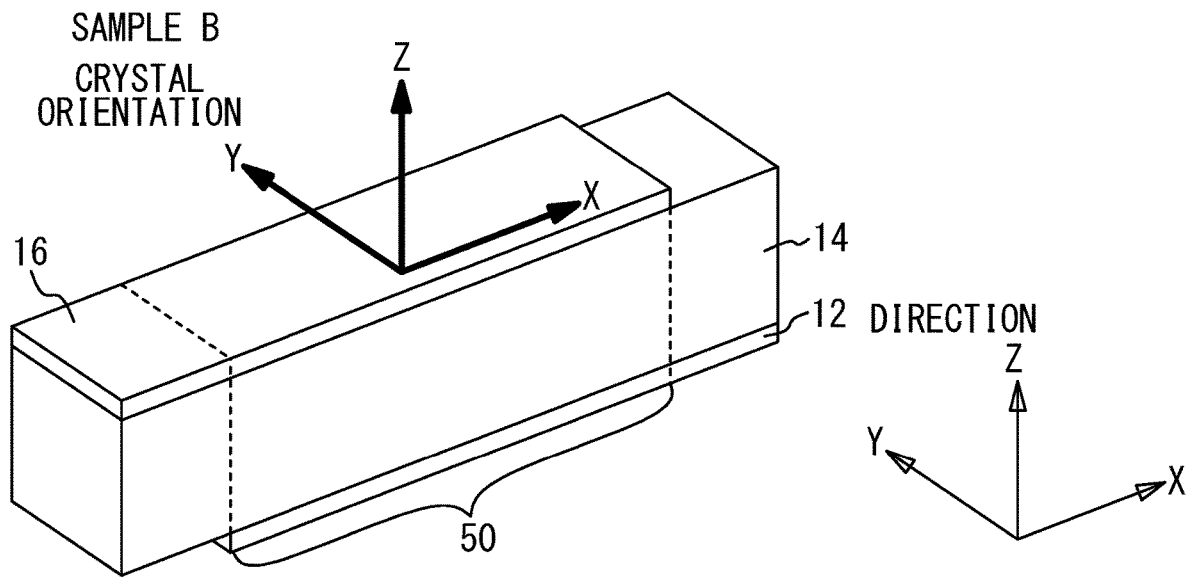
FIG. 4A and FIG. 4B are perspective views illustrating the crystal orientations of the piezoelectric layer in a sample B.
Figure 4B:
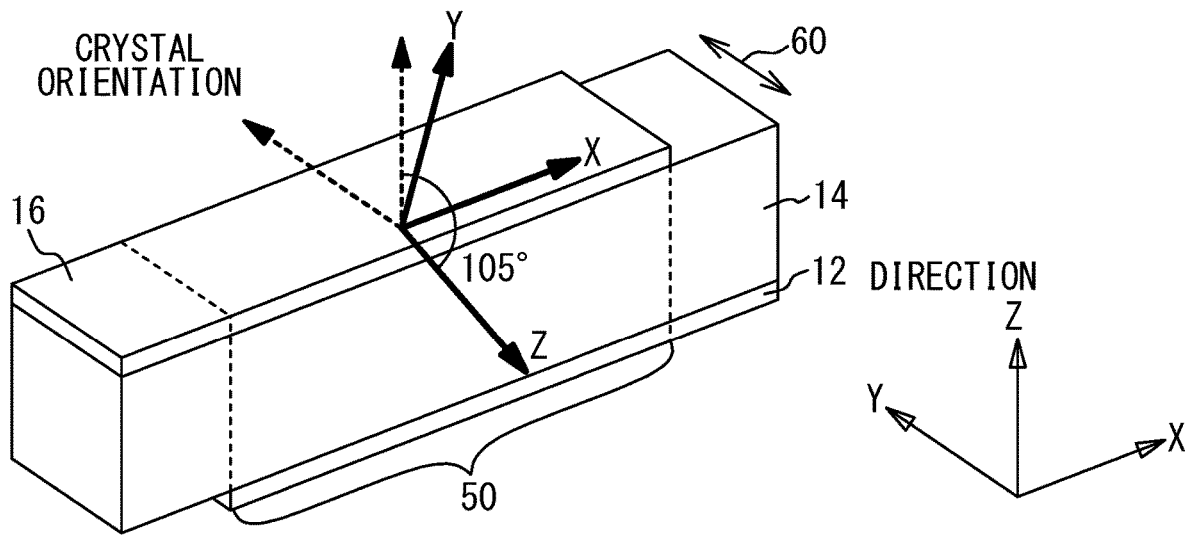

The simulation 1 simulated the resonance characteristics of samples A and B between which the extraction directions of the lower electrode 12 and the upper electrode 16 with respect to the vibration direction of the thickness-shear vibration excited in the piezoelectric layer 14 are different. FIG. 3A to FIG. 3C are perspective views illustrating the crystal orientations of the piezoelectric layer 14 in the sample A. FIG. 4A and FIG. 4B are perspective views illustrating the crystal orientations of the piezoelectric layer 14 in the sample B. Here, Euler angles (α, β, γ) are defined as follows. In a right-handed XYZ coordinate system, a normal direction of the upper surface of the piezoelectric layer 14 is defined as a Z direction, and directions orthogonal to the Z direction and orthogonal to each other in a plane direction of the upper surface of the piezoelectric layer 14 are defined as an X direction and a Y direction. First, the X direction, the Y direction, and the Z direction are configured to be correspond to the X-axis orientation, the Y-axis orientation, and the Z-axis orientation of the crystal orientations, respectively. Then, the +X-axis orientation is rotated by α about the Z-axis orientation from the +X-axis orientation to the +Y-axis orientation. The +Y-axis orientation is rotated by β about the X-axis orientation after the rotation of α from the +Y-axis orientation to the +Z-axis orientation. The +X-axis orientation is rotated by γ about the Z-axis orientation after the rotation of β from the +X-axis orientation to the +Y-axis orientation. The Euler angles of the crystal obtained by rotating the crystal orientations in this manner are (α, β, γ). In the present embodiment, α, β, and γ are expressed using 0° to 180°, but the Euler angles expressed using (α, β, γ) include equivalent Euler angles. For example, the equivalent Euler angles include Euler angles obtained by fixing the crystal axes of the crystal orientation of the piezoelectric layer 14 and rotating the coordinate axes of the orthogonal coordinate system of the piezoelectric layer 14.

With reference to FIG. 3A to FIG. 3C, a description will be given of the crystal orientations of the piezoelectric layer 14 in the sample A. FIG. 3C shows the actual crystal orientation of the piezoelectric layer 14 with respect to the XYZ coordinate system depicted in the drawing for the sample A, and FIG. 3A is provided for explaining the actual orientation of FIG. 3B. As illustrated in FIG. 3A, the +X direction, the +Y direction, and the +Z direction are made to correspond to the +X-axis orientation, the +Y-axis orientation, and the +Z-axis orientation of the crystal orientations of the piezoelectric layer 14, respectively. As illustrated in FIG. 3B, from the state illustrated in FIG. 3A, the +X-axis orientation and the +Y-axis orientation are rotated 90° in the X-axis-Y-axis plane about the Z-axis orientation from the +X-axis orientation to the +Y-axis orientation. Then, as illustrated in FIG. 3C, the +Y-axis orientation and the +Z-axis orientation are rotated 105° in the Y-axis-Z-axis plane about the X-axis orientation from the +Y-axis orientation to the +Z-axis orientation. In the case that the crystal orientations of the piezoelectric layer 14 have been rotated as described above, the +Z direction corresponds to the direction obtained by rotating the +Z-axis orientation 105° toward the +Y-axis orientation. In this case, the X direction corresponds to a vibration direction 60 of the thickness-shear vibration. The crystal orientations of the piezoelectric layer 14 are (90°, 105°, 0°) in Euler angles.

The lower electrode 12 is extracted from the resonance region 50 in the +X direction, and the upper electrode 16 is extracted from the resonance region 50 in the −X direction. Thus, in the sample A, the lower electrode 12 and the upper electrode 16 are extracted from the resonance region 50 in the same direction as the vibration direction 60 of the thickness-shear vibration.

Next, a description will be given of the crystal orientations of the piezoelectric layer 14 in the sample B with reference to FIG. 4A and FIG. 4B. FIG. 4B shows the actual crystal orientation of the piezoelectric layer 14 with respect to the XYZ coordinate system depicted in the drawing for the sample B, and FIGS. 4A-4B are provided for explaining the actual orientation of FIG. 4C. As illustrated in FIG. 4A, the +X direction, the +Y direction, and the +Z direction are made to correspond to the +X-axis orientation, the +Y-axis orientation, and the +Z-axis orientation of the crystal orientations of the piezoelectric layer 14, respectively. As illustrated in FIG. 4B, from the state of FIG. 4A, the +Y-axis orientation and the +Z-axis orientation are rotated 105° in the Y-axis-Z-axis plane about the X-axis orientation from the +Y-axis orientation to the +Z-axis orientation. In the case that the crystal orientations of the piezoelectric layer 14 have been rotated as described above, the +Z direction corresponds to the direction obtained by rotating the +Z-axis orientation 105° toward the +Y-axis orientation. In this case, the Y direction corresponds to the vibration direction 60 of the thickness-shear vibration. The crystal orientations of the piezoelectric layer 14 are (0°, 105°, 0°) in Euler angles.

The lower electrode 12 is extracted from the resonance region 50 in the +X direction, and the upper electrode 16 is extracted from the resonance region 50 in the −X direction. Thus, in the sample B, the lower electrode 12 and the upper electrode 16 are extracted from the resonance region 50 in the orthogonal direction to the vibration direction 60 of the thickness-shear vibration.

Figure 5:
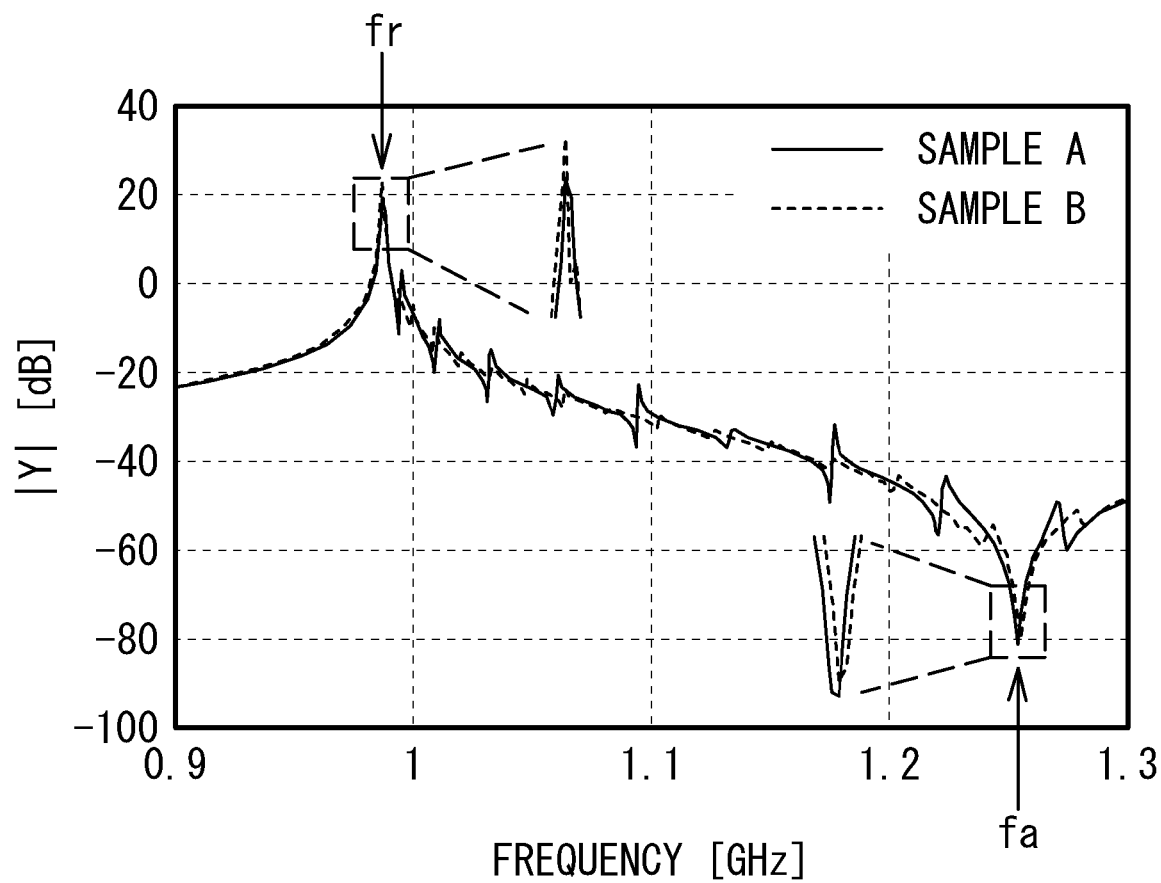
FIG. 5 presents simulation results of admittance |Y| with respect to frequency in the sample A and the sample B.

FIG. 5 presents simulation results of admittance |Y| with respect to frequency in the samples A and B. As presented in FIG. 5, at the resonant frequency fr, the sample B has a larger admittance |Y| and a larger Q factor than the sample A. At the antiresonant frequency fa, the sample A has a smaller admittance |Y| and a larger Q factor than the sample B.

Here, for the samples A and B, the amount of the displacement generated in the resonance region 50 when the high frequency power is applied between the lower electrode 12 and the upper electrode 16 was simulated. The simulation results show that the maximum amount of displacement at the resonant frequency is 1.5 nm in the sample A, while the maximum amount of displacement at the resonant frequency is 2.0 nm in the sample B.

As seen from the above, obtained was the result that the maximum amount of displacement at the resonant frequency in the sample B is greater than that in the sample A. As the amount of displacement becomes larger, the Q factor tends to be larger. This is considered the reason why at the resonant frequency fr, the Q factor of the sample B is greater than that of the sample A as presented in FIG. 5. It is considered that the same applies for the antiresonant frequency fa.

The insertion loss of the passband of the filter decreases as the Q factor of the resonator increases. In the ladder-type filter, the passband is formed by the resonant frequency of the series resonator and the antiresonant frequency of the parallel resonator. Therefore, the transmission characteristics of the filter can be improved by using the resonator having a large Q factor at the resonant frequency for the series resonator and the resonator having a large Q factor at the antiresonant frequency for the parallel resonator. The above simulation results reveal that it is preferable to use the sample A, which has a large Q factor at the antiresonant frequency fa, for the parallel resonator and use the sample B, which has a large Q factor at the resonant frequency fr, for the series resonator.

In the sample A, the lower electrode 12 and the upper electrode 16 are extracted from the resonance region 50 in the same direction as the vibration direction 60 of the thickness-shear vibration. In the sample B, the lower electrode 12 and the upper electrode 16 are extracted from the resonance region 50 in the orthogonal direction to the vibration direction 60 of the thickness-shear vibration. Thus, the piezoelectric thin film resonator in which the lower electrode and the upper electrode are extracted from the resonance region in substantially the same direction as the vibration direction of the thickness-shear vibration is used for the parallel resonator of the ladder-type filter. The piezoelectric thin film resonator in which the lower electrode and the upper electrode are extracted from the resonance region in a substantially orthogonal direction to the vibration direction of the thickness-shear vibration is used for the series resonator of the ladder-type filter. This improves the transmission characteristics of the ladder-type filter.

Simulation 2

Figure 6:
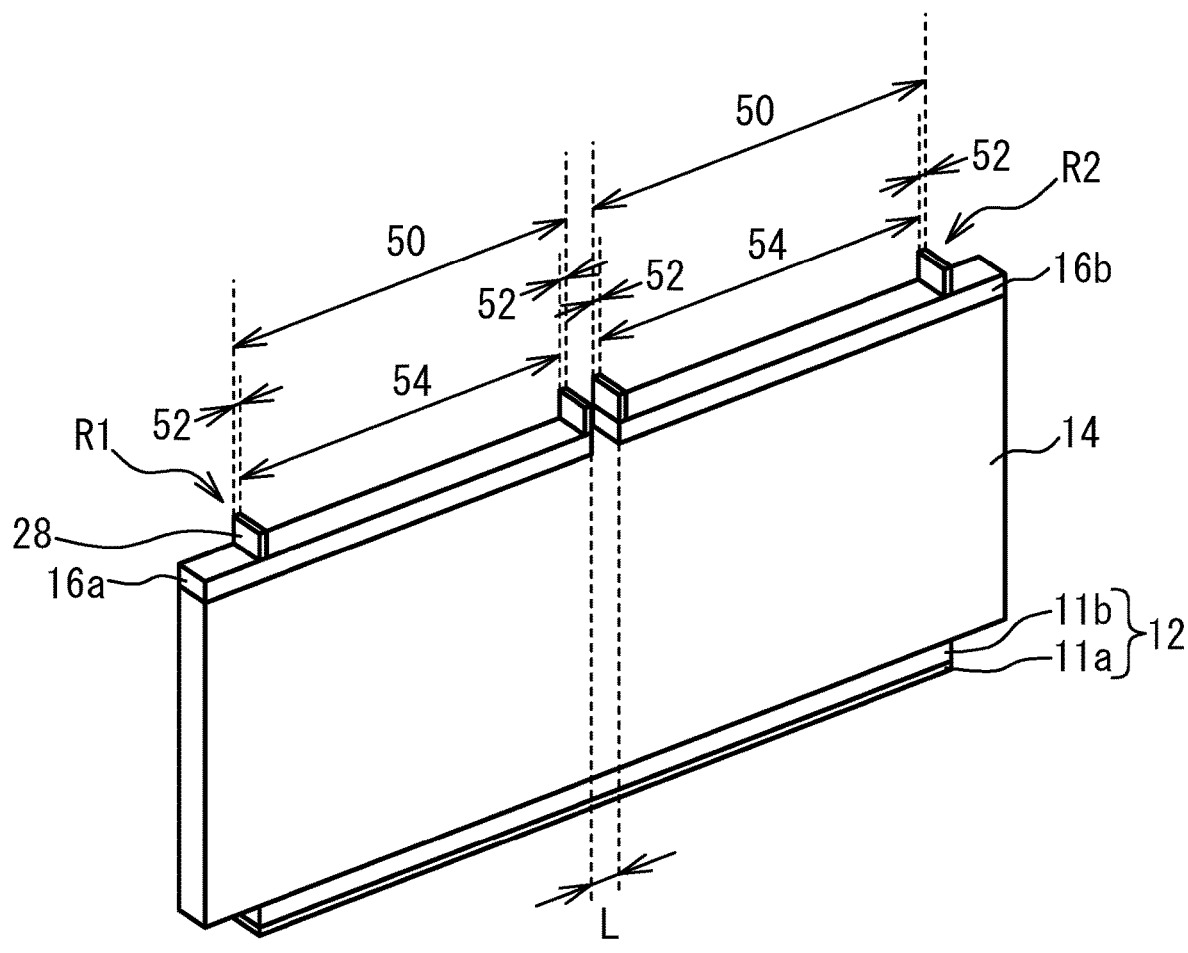
FIG. 6 is a perspective view of a model used in a simulation 2.

FIG. 6 is a perspective view of a model used in a simulation 2. As illustrated in FIG. 6, in the model used in the simulation 2, the piezoelectric layer 14 is provided on the lower electrode 12 having the lower layer 11a and the upper layer 11b, and upper electrodes 16a and 16b are provided on the piezoelectric layer 14. Therefore, a piezoelectric thin film resonator R1, which has the lower electrode 12, the piezoelectric layer 14, and the upper electrode 16a, and a piezoelectric thin film resonator R2, which has the lower electrode 12, the piezoelectric layer 14, and the upper electrode 16b, are adjacent to each other. The piezoelectric thin film resonator R1 and the piezoelectric thin film resonator R2 share the single lower electrode 12 and the single piezoelectric layer 14. In the piezoelectric thin film resonators R1 and R2, additional films 28 are provided on the respective upper electrodes 16a and 16b in edge regions 52 located on both sides of a center region 54 of the resonance region 50 in the X direction.

The resonance characteristics of the piezoelectric thin film resonator R1 when the same high frequency power is applied between the lower electrode 12 and the upper electrode 16a and between the lower electrode 12 and the upper electrode 16b were simulated for samples having different distances L between the piezoelectric thin film resonator R1 and the piezoelectric thin film resonator R2. Simulation conditions are as follows.

Wavelength λ of the acoustic wave: Two times the thickness of the piezoelectric layer 14

Vibration direction of the thickness-shear vibration: Y direction

Lower layer 11a of the lower electrode 12: Chrome layer with a thickness of 18 nm Upper layer 11b of the lower electrode 12: Ruthenium layer with a thickness of 100 nm Piezoelectric layer 14: Lithium niobate layer with a thickness of 1300 nm Upper electrode 16: Ruthenium layer with a thickness of 100 nm Additional film 28: Ruthenium film with a thickness of 100 nm and a width in the X direction of 1.95 μm Conditions in the X direction: Width of the resonance region 50 in the X direction is 30λ.

Conditions in the Y direction: Width of the resonance region 50 in the Y direction is 0.5λ, and the boundary condition is continuous infinitely.

Distance L: 0.5λ, 0.625λ, 0.75λ, 0.875λ, 1.0λ

Figure 7:
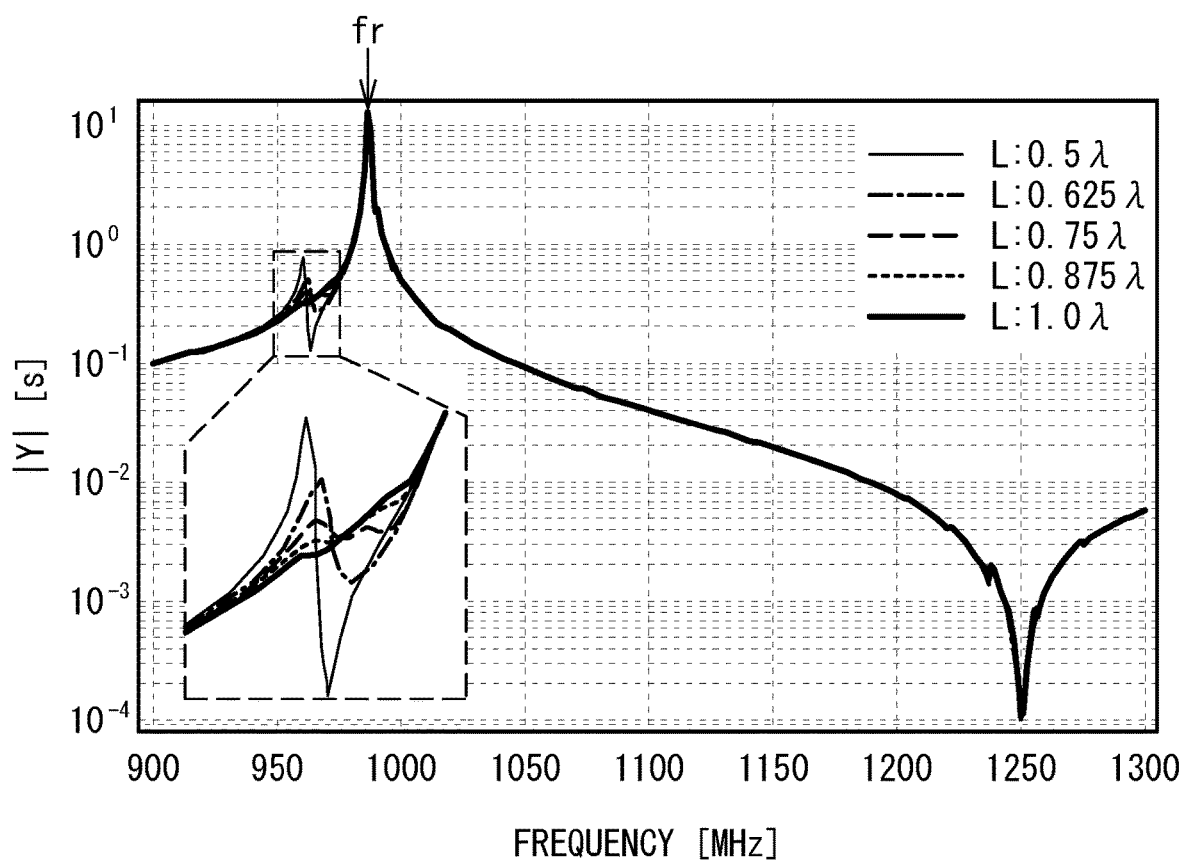
FIG. 7 presents simulation results of admittance |Y| with respect to frequency in a piezoelectric thin film resonator R1.

FIG. 7 presents simulation results of admittance |Y| with respect to frequency in the piezoelectric thin film resonator R1. As illustrated in FIG. 7, in the case that the distance L is short, spurious emissions are generated at frequencies lower than the resonant frequency fr due to the adjacent piezoelectric thin film resonator R2. However, as the distance L increases, spurious emissions are reduced. At a distance L of 0.75λ, spurious emissions are sufficiently reduced, and at a distance L of 1.0λ, spurious emissions are hardly generated.

The results of the simulation 2 reveal that the distance L between the adjacent piezoelectric thin film resonators is preferably 0.75λ or greater, more preferably 0.875λ or greater, further preferably 1.0λ or greater. That is, it is revealed that in one piezoelectric thin film resonator, the lower electrode 12 and the upper electrode 16 are extracted from the resonance region 50 preferably by a length of 0.375λ or greater, more preferably by a length of 0.4375λ or greater, further preferably by a length of 0.5λ or greater.

Figure 8:
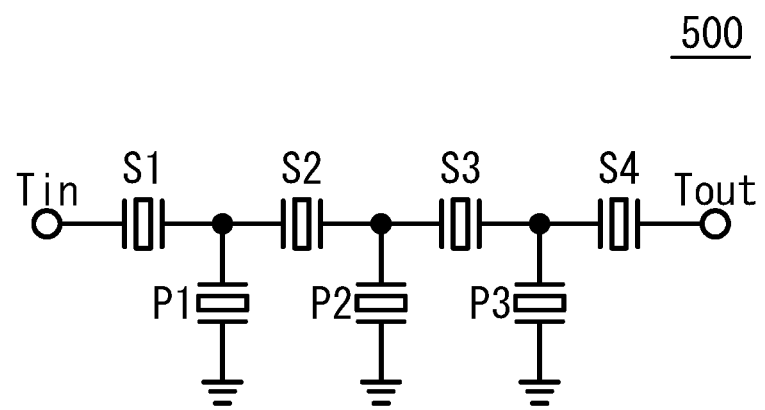
FIG. 8 is a circuit diagram of the filter in accordance with the first embodiment.

FIG. 8 is a circuit diagram of a filter 500 in accordance with the first embodiment. As illustrated in FIG. 8, in the filter 500, one or more series resonators S1 to S4 are connected in series between an input terminal Tin and an output terminal Tout, and one or more parallel resonators P1 to P3 are connected in parallel between the input terminal Tin and the output terminal Tout. One or more series resonators S1 to S4 are provided in the path between the input terminal Tin and the output terminal Tout. First ends of the one or more parallel resonators P1 to P3 are coupled to the path between the input terminal Tin and the output terminal Tout, and second ends of the one or more parallel resonators P1 to P3 are grounded (are coupled to ground terminals Tg). The number of resonators in the ladder-type filter can be freely selected.

Figure 9A:
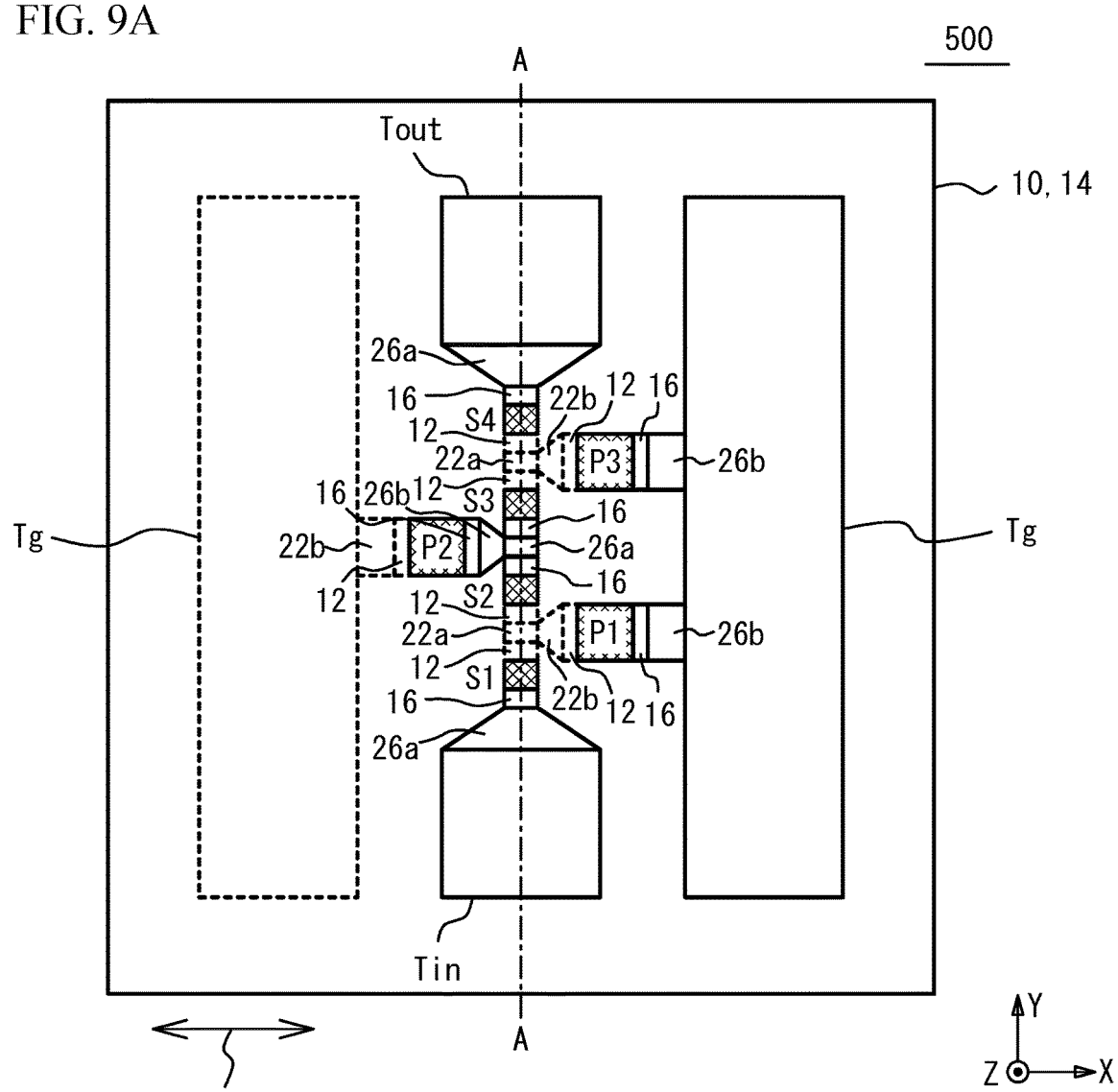
FIG. 9A is a plan view of the filter in accordance with the first embodiment.
Figure 9B:
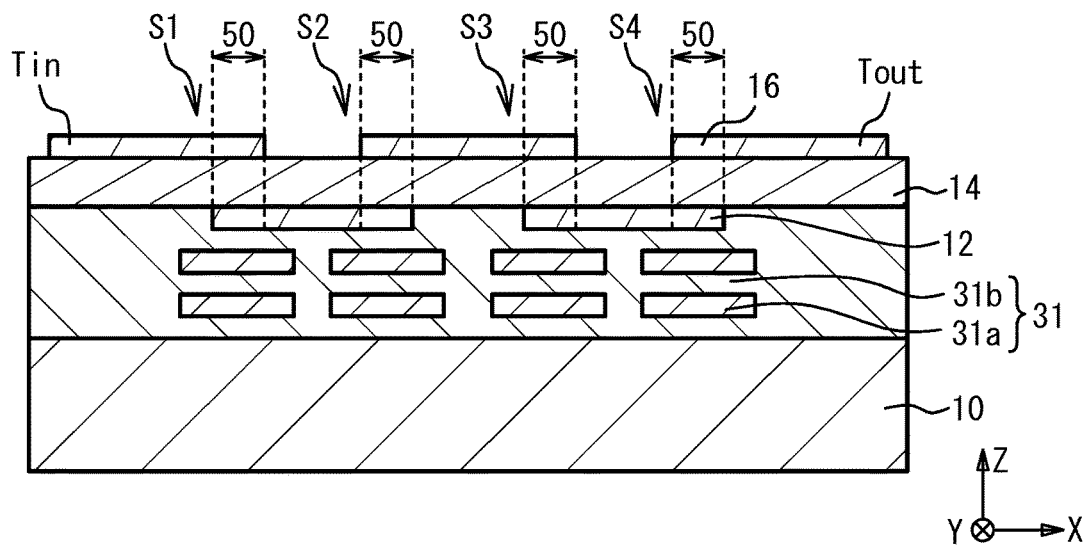
FIG. 9B is a cross-sectional view taken along line A-A in FIG. 9A.

FIG. 9A is a plan view of the filter 500 in accordance with the first embodiment, and FIG. 9B is a cross-sectional view taken along line A-A in FIG. 9A. In FIG. 9A, the lower electrode 12 and lower wiring lines 22a and 22b are indicated by dashed lines, and the upper electrode 16 and upper wiring lines 26a and 26b are indicated by solid lines. In addition, in FIG. 9A, the respective resonance regions 50 of the series resonators S1 to S4 and the parallel resonators P1 to P3 are indicated by hatching. As illustrated in FIG. 9A and FIG. 9B, the series resonators S1 to S4 and the parallel resonators P1 to P3 are formed using the single piezoelectric layer 14.

Figure 10A:
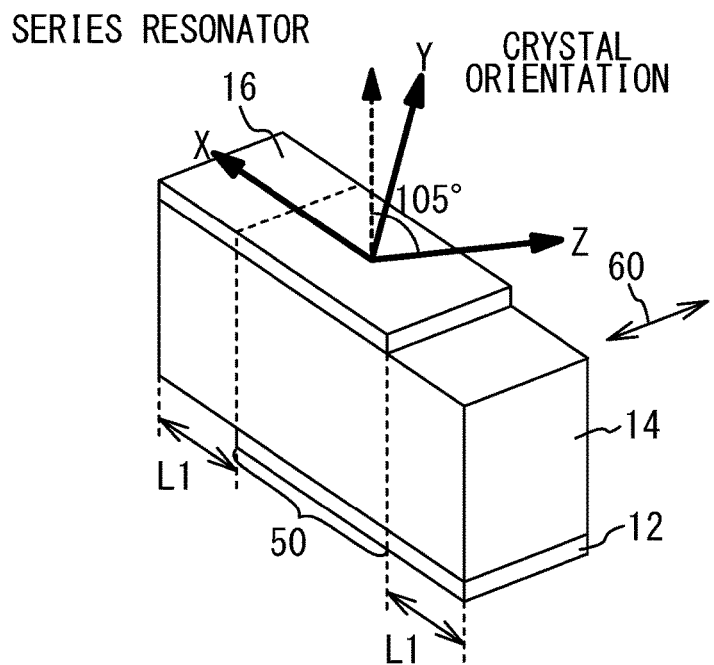
FIG. 10A is a perspective view of a series resonator in the filter in accordance with the first embodiment.
Figure 10A:
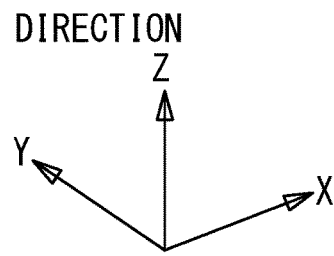
Figure 10B:
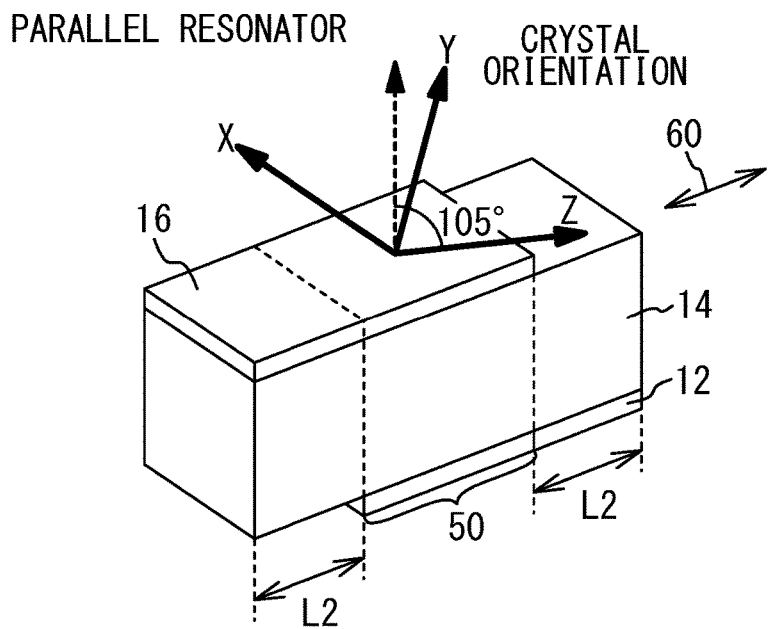
FIG. 10B is a perspective view of a parallel resonator in the filter in accordance with the first embodiment.
Figure 10B:
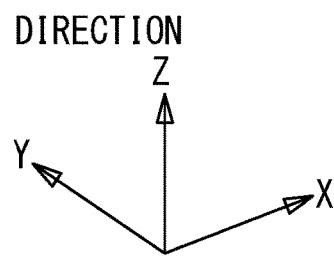

FIG. 10A is a perspective view of the series resonators S1 to S4 in the filter 500 in accordance with the first embodiment, and FIG. 10B is a perspective view of the parallel resonators P1 to P3 in the filter 500. Since the piezoelectric layer 14 is a monocrystalline lithium niobate layer, as illustrated in FIG. 10A and FIG. 10B, the vibration direction 60 of the thickness-shear vibration corresponds to a direction substantially orthogonal to the X-axis orientation of the crystal orientations of the piezoelectric layer 14, and corresponds to substantially the X direction. For example, the crystal orientations of the piezoelectric layer 14 are (90°±5°, 105°±5°, 0°±5°) in Euler angles.

As illustrated in FIG. 10A, the lower electrode 12 and the upper electrode 16 of each of the series resonators S1 to S4 are extracted linearly from the corresponding resonance region 50 in a direction substantially parallel to the X-axis orientation of the crystal orientations of the piezoelectric layer 14 (e.g., the Y direction). In other words, the lower electrode 12 and the upper electrode 16 of each of the series resonators S1 to S4 are linearly extracted from the corresponding resonance region 50 in a substantially orthogonal direction to the vibration direction 60 of the thickness-shear vibration. As illustrated in FIG. 10B, the lower electrode 12 and the upper electrode 16 of each of the parallel resonators P1 to P3 are linearly extracted from the corresponding resonance region 50 in a direction substantially orthogonal to the X-axis orientation of the crystal orientations of the piezoelectric layer 14 (e.g., the X direction). In other words, the lower electrode 12 and the upper electrode 16 of each of the parallel resonators P1 to P3 are linearly extracted from the corresponding resonance region 50 in the same direction as the vibration direction 60 of the thickness-shear vibration.

As illustrated in FIG. 9A and FIG. 9B, the series resonators S1 to S4 are linearly arranged in the Y direction. Thus, the direction in which the series resonators S1 to S4 are arranged, and the direction in which the lower electrodes 12 and the upper electrodes 16 of the series resonators S1 to S4 are extracted from the respective resonance regions 50 are substantially the same direction. The lower electrode 12 and the upper electrode 16 of each of the parallel resonators P1 to P3 are extracted from the corresponding resonance region 50 in a substantially orthogonal direction to the direction in which the series resonators S1 to S4 are arranged. In the series resonators S1 to S4 and the parallel resonators P1 to P3, the length (the width) of each of the parts extracted from the resonance region 50 of the lower electrode 12 and the upper electrode 16 in the orthogonal direction to the extraction direction is a constant length equal to or larger than the length (the width) of the resonance region 50 in the orthogonal direction to the extraction direction.

The series resonator S1 is coupled to the input terminal Tin by the upper wiring line 26a of which the width increases at farther distances from the upper electrode 16. The series resonator S4 is coupled to the output terminal Tout by the upper wiring line 26a of which the width increases at farther distances from the upper electrode 16. The parallel resonator P1 is coupled to the lower wiring line 22a between the series resonators S1 and S2 by the lower wiring line 22b of which the width decreases at farther distances from the lower electrode 12. The parallel resonator P3 is coupled to the lower wiring line 22a between the series resonators S3 and S4 by the lower wiring line 22b of which the width decreases at farther distances from the lower electrode 12. The parallel resonator P2 is coupled to the upper wiring line 26a between the series resonators S2 and S3 by the upper wiring line 26b of which the width decreases at farther distances from the upper electrode 16. Here, the lower electrode 12 and the upper electrode 16 are portions extracted from the resonance region 50 at a predetermined length. The lower wiring lines 22a and 22b and the upper wiring lines 26a and 26b are portions connecting between the electrodes of the adjacent resonators or between the electrode of the resonator and the terminal, and are connected to the end of the electrode opposite from the resonance region 50 of the electrode. The electrodes and the wiring lines may be formed of the same material or different materials.

Variation of the First Embodiment

Figure 11:
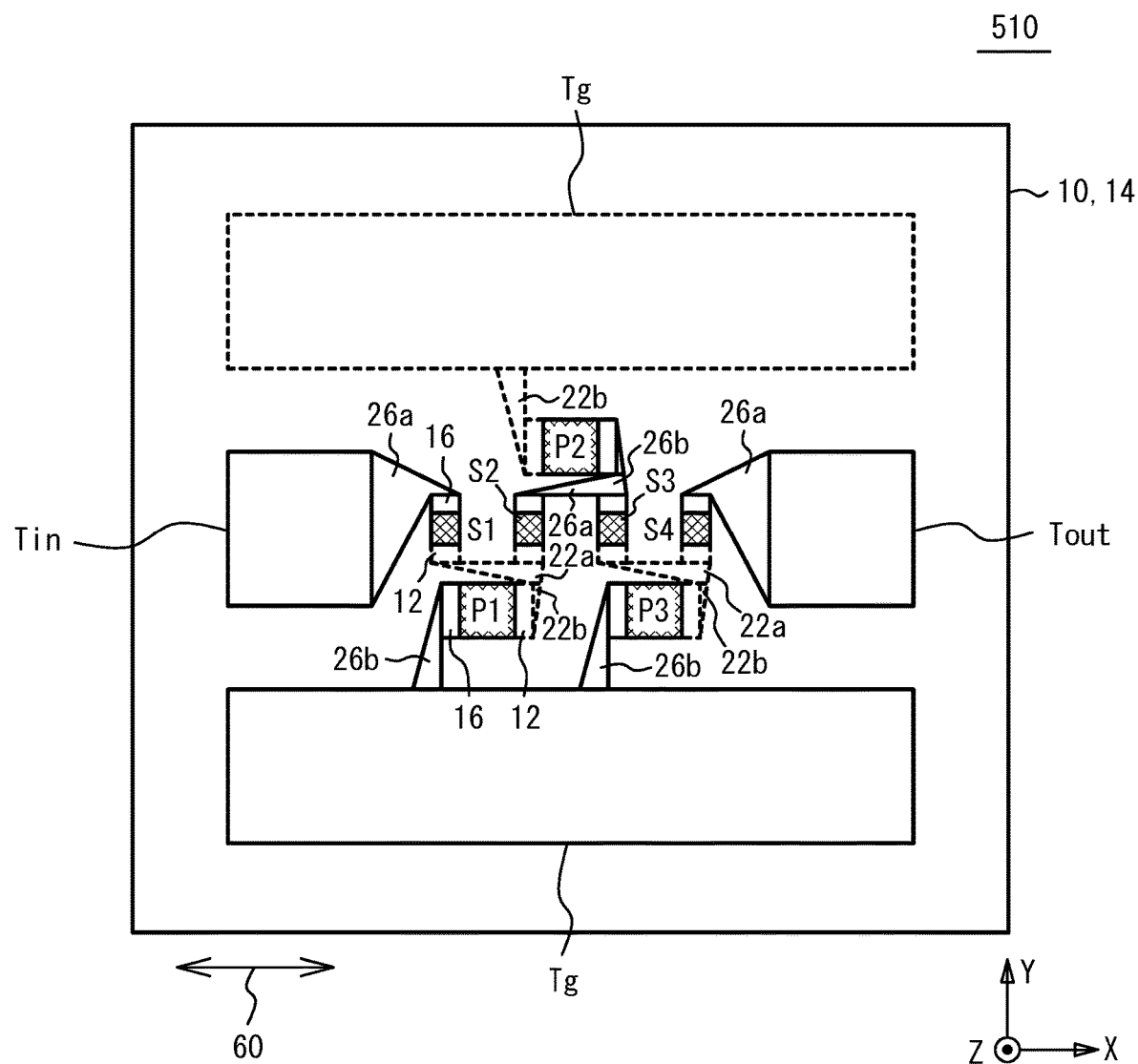
FIG. 11 is a plan view of a filter in accordance with a first variation of the first embodiment.

FIG. 11 is a plan view of a filter 510 in accordance with a variation of the first embodiment. As illustrated in FIG. 11, the series resonators S1 to S4 are linearly arranged in the X direction. Therefore, the direction in which the series resonators S1 to S4 are arranged is substantially orthogonal to the direction in which the lower electrodes 12 and the upper electrodes 16 of the series resonators S1 to S4 are extracted from the respective resonance regions 50. The lower electrodes 12 and the upper electrodes 16 of the parallel resonators P1 to P3 are extracted from the respective resonance regions 50 in substantially the same direction as the direction in which the series resonators S1 to S4 are arranged. The series resonator S1 is coupled to the input terminal Tin by the upper wiring line 26a extracted from the upper electrode 16 in the direction intersecting with the Y direction. The series resonator S4 is coupled to the output terminal Tout by the upper wiring line 26a extracted from the upper electrode 16 in the direction intersecting with the Y direction. The parallel resonators P1 and P3 are coupled to the respective ground terminals Tg by the upper wiring lines 26b extracted from the respective upper electrodes 16 in the direction intersecting with the X direction. The parallel resonator P2 is coupled to the ground terminal Tg by the lower wiring line 22b extracted from the lower electrode 12 in the direction intersecting with the X direction. Other structures are the same as those of the first embodiment, and the description thereof is thus omitted.

In the first embodiment and the variation thereof, as illustrated in FIG. 10A and FIG. 10B, the piezoelectric layer 14 is a monocrystalline lithium niobate layer, the X-axis orientation of the crystal orientations of the piezoelectric layer 14 corresponds to a planar direction, and the thickness direction of the piezoelectric layer 14 corresponds to a direction obtained by rotating the +Z-axis orientation of the crystal orientations substantially 105° toward the +Y-axis orientation. In this case, the vibration direction 60 of the thickness-shear vibration corresponds to a direction substantially orthogonal to the X-axis orientation of the crystal orientations of the piezoelectric layer 14. As illustrated in FIG. 10A, the lower electrode 12 and the upper electrode 16 (a pair of first electrodes) of each of the series resonators S1 to S4 are extracted from the corresponding resonance region 50 in a direction substantially parallel to the X-axis orientation of the crystal orientations of the piezoelectric layer 14. As illustrated in FIG. 10B, the lower electrode 12 and the upper electrode 16 (a pair of second electrodes) of each of the parallel resonators P1 to P3 are extracted from the corresponding resonance region 50 in a direction substantially orthogonal to the X-axis orientation of the crystal orientations of the piezoelectric layer 14. This structure allows the Q factor at the resonant frequency of each of the series resonators S1 to S4 and the Q factor at the antiresonant frequency of each of the parallel resonators P1 to P3 to be large. Therefore, the transmission characteristics of the filter can be improved. The term "substantially 105°" used in the description "the direction obtained by rotating the +Z-axis orientation of the crystal orientations of the piezoelectric layer 14 substantially 105° toward the +Y-axis orientation" is an angle within a range of 105°±5°, preferably an angle within a range of 105°±3°, more preferably an angle within a range of 105°±1°. The substantially orthogonal direction to the X-axis orientation of the crystal orientations of the piezoelectric layer 14 is a direction at an angle within a range of ±5° from the orthogonal direction to the X-axis orientation, preferably a direction at an angle within a range of ±3° from the orthogonal direction to the X-axis orientation, more preferably a direction at an angle within a range of ±1° from the orthogonal direction to the X-axis orientation. Similarly, substantially the same direction as the X-axis orientation of the crystal orientations of the piezoelectric layer 14 is a direction at an angle within a range of ±5° from the X-axis orientation, preferably a direction at an angle within a range of ±3° from the X-axis orientation, more preferably a direction within a range of ±1° from the X-axis orientation.

The length L1 (see FIG. 10A) by which the lower electrode 12 and the upper electrode 16 of each of the series resonators S1 to S4 are linearly extracted from the corresponding resonance region 50 in a direction substantially parallel to the X-axis orientation of the crystal orientations of the piezoelectric layer 14 is preferably equal to or greater than 0.75 times the thickness of the piezoelectric layer 14 in the corresponding resonance region 50 (equal to or greater than 0.375λ). Similarly, the length L2 (see FIG. 10B) by which the lower electrode 12 and the upper electrode 16 of each of the parallel resonators P1 to P3 are linearly extracted from the corresponding resonance region 50 in a direction substantially orthogonal to the X-axis orientation of the crystal orientations of the piezoelectric layer 14 is preferably equal to or greater than 0.75 times the thickness of the piezoelectric layer 14 in the resonance region 50 (equal to or greater than 0.375λ). This structure can reduce spurious emissions as illustrated in FIG. 7. Since FIG. 7 presents the simulation results relating to the interference of the leakage of the acoustic wave between the adjacent resonators, it suggests that the same results will be obtained regardless of the crystal orientation of the piezoelectric layer 14. To reduce spurious emissions, the length L1 by which the lower electrode 12 and the upper electrode 16 of each of the series resonators S1 to S4 are extracted from the corresponding resonance region 50 is preferably equal to or greater than 0.8 times, more preferably equal to or greater than 0.9 times, further preferably equal to or greater than 1.0 time the thickness of the piezoelectric layer 14 in the corresponding resonance region 50. Similarly, the length L2 by which the lower electrode 12 and the upper electrode 16 of each of the parallel resonators P1 to P3 are extracted from the corresponding resonance region 50 is preferably equal to or greater than 0.8 times, more preferably equal to or greater than 0.9 times, further preferably equal to or greater than 1.0 time the thickness of the piezoelectric layer 14 in the corresponding resonance region 50.

In the first embodiment, as illustrated in FIG. 9A, the series resonators S1 to S4 are arranged side by side in substantially the same direction as the direction in which the lower electrodes 12 and the upper electrodes 16 of the series resonators S1 to S4 are extracted from the respective resonance regions 50. Such an arrangement inhibits the lower wiring lines 22a and 22b and the upper wiring lines 26a and 26b from being complicated. The term "arranged in substantially the same direction" means that the series resonators S1 to S4 are arranged in a direction at an angle within a range of ±10° from the direction in which the lower electrodes 12 and the upper electrodes 16 of the series resonators S1 to S4 are extracted from the respective resonance regions 50. In the case that the series resonators S1 to S4 are arranged side by side in substantially the same direction as the extraction direction of the lower electrode 12 and the upper electrode 16, it is preferable that the series resonator S1 is coupled to the input terminal Tin by the upper wiring line 26a (a first wiring line) of which the width increases at farther distances from the upper electrode 16, and the series resonator S4 is coupled to the output terminal Tout by the upper wiring line 26a (the first wiring line) of which the width increases at farther distances from the upper electrode 16. This structure allows the input terminal Tin and the output terminal Tout to be large, and can reduce the electric resistance between the input terminal Tin and the series resonator S1 and the electric resistance between the output terminal Tout and the series resonator S4. In addition, it is preferable that each of the parallel resonators P1 to P3 is coupled to the lower wiring line 22a or the upper wiring line 26a (the first wiring line) by the lower wiring line 22b or the upper wiring line 26b (a second wiring line), of which the width decreases at farther distances from the lower electrode 12 or the upper electrode 16. This structure miniaturizes the filter 500.

In the variation of the first embodiment, as illustrated in FIG. 11, the series resonators S1 to S4 are arranged side by side in a direction substantially orthogonal to the direction in which the lower electrodes 12 and the upper electrodes 16 of the series resonators S1 to S4 are extracted from the respective resonance regions 50. The term "arranged in a substantially orthogonal direction" means that the series resonators S1 to S4 are arranged side by side in a direction at an angle within a range of ±10° from the orthogonal direction to the direction in which the lower electrodes 12 and the upper electrodes 16 of the series resonators S1 to S4 are extracted from the respective resonance regions 50. The series resonator S1 is coupled to the input terminal Tin by the upper wiring line 26a (the first wiring line) extracted from the upper electrode 16 in the direction intersecting with the direction in which the lower electrode 12 and the upper electrode 16 are extracted from the resonance region 50. The series resonator S4 is coupled to the output terminal Tout by the upper wiring line 26a (the first wiring line) extracted from the upper electrode 16 in the direction intersecting with the direction in which the lower electrode 12 and the upper electrode 16 are extracted from the resonance region 50. Each of the parallel resonators P1 to P3 is coupled to the ground terminal Tg by the lower wiring line 22b or the upper wiring line 26b (the second wiring line) extracted from the lower electrode 12 or the upper electrode 16 in the direction intersecting with the direction in which the lower electrode 12 and the upper electrode 16 are extracted from the resonance region 50. This allows the input terminal Tin, the output terminal Tout, and the ground terminal Tg to be arranged in appropriate positions, and can miniaturize the filter 510.

In the series resonators S1 to S4 and the parallel resonators P1 to P3, it is preferable that the upper electrode 16 and the lower electrode 12, which has a larger width than the upper electrode 16 in the orthogonal direction to the direction in which the lower electrode 12 and the upper electrode 16 are extracted from the resonance region 50, are opposite to each other across the piezoelectric layer 14 to form the resonance region 50 as illustrated in FIG. 1A. This structure inhibits the size and the shape of the resonance region 50 from varying even when the lower electrode 12 and the upper electrode 16 are formed at positions deviating from the predetermined positions. The difference D between the width of the lower electrode 12 and the width of the upper electrode 16 is preferably 0.5 μm or greater, more preferably 0.7 μm or greater, further preferably 0.9 μm or greater, in consideration of the position deviation. On the other hand, to decrease the size, the difference D is preferably 1.5 μm or less, more preferably 1.3 μm or less, further preferably 1 μm or less. It is not limited to the case in which the width of the lower electrode 12 is larger than the width of the upper electrode 16, and the width of the upper electrode 16 may be larger than the width of the lower electrode 12.

To ease the manufacture and miniaturize the filter, the piezoelectric layers of the series resonators S1 to S4 and the piezoelectric layers of the parallel resonators P1 to P3 are formed of the single continuous piezoelectric layer 14 as illustrated in FIG. 9A and FIG. 9B.

Variation of the Piezoelectric Thin Film Resonator

Figure 12:
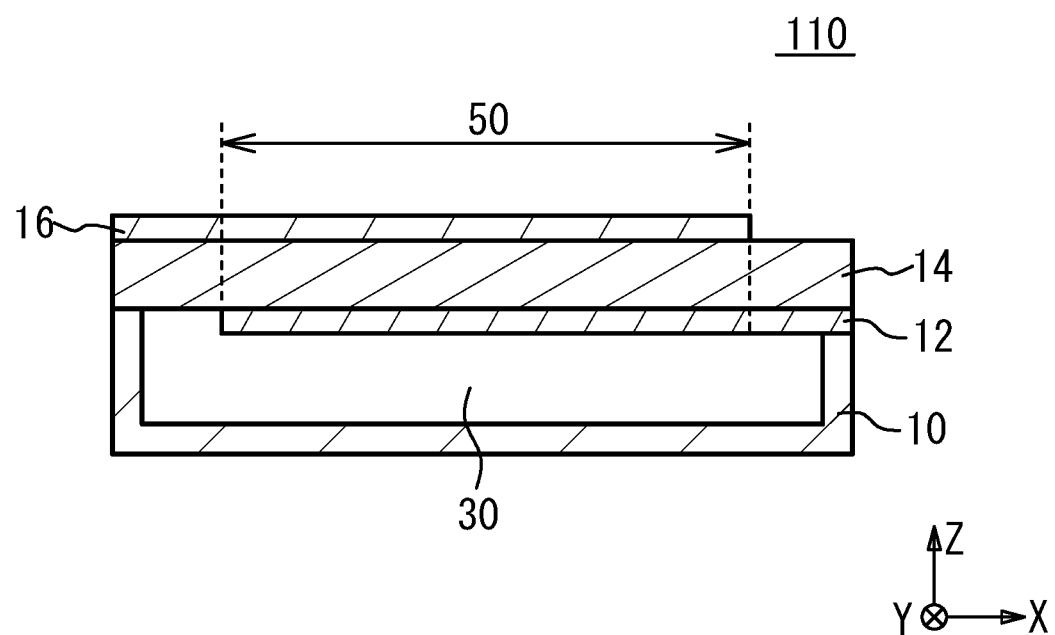
FIG. 12 is a cross-sectional view of a piezoelectric thin film resonator in accordance with a variation.

FIG. 12 is a cross-sectional view of a piezoelectric thin film resonator 110 in accordance with a variation. As illustrated in FIG. 12, in the piezoelectric thin film resonator 110, a recessed portion is formed in the substrate 10 to provide an air gap 30 between the substrate 10 and the lower electrode 12 instead of the acoustic mirror 31 over the substrate 10. Other structures are the same as those of the piezoelectric thin film resonator 100 illustrated in FIG. 1A and FIG. 1B, and the description thereof is thus omitted.

The piezoelectric thin film resonator used in the filters of the first embodiment and the variation of the first embodiment may be a solid mounted resonator (SMR) having the acoustic mirror 31 overlapping the resonance region 50 as illustrated in FIG. 1A and FIG. 1B. As illustrated in FIG. 12, the piezoelectric thin film resonator may be a film bulk acoustic resonator (FBAR) having the air gap 30 overlapping the resonance region 50.

Figure 13A:
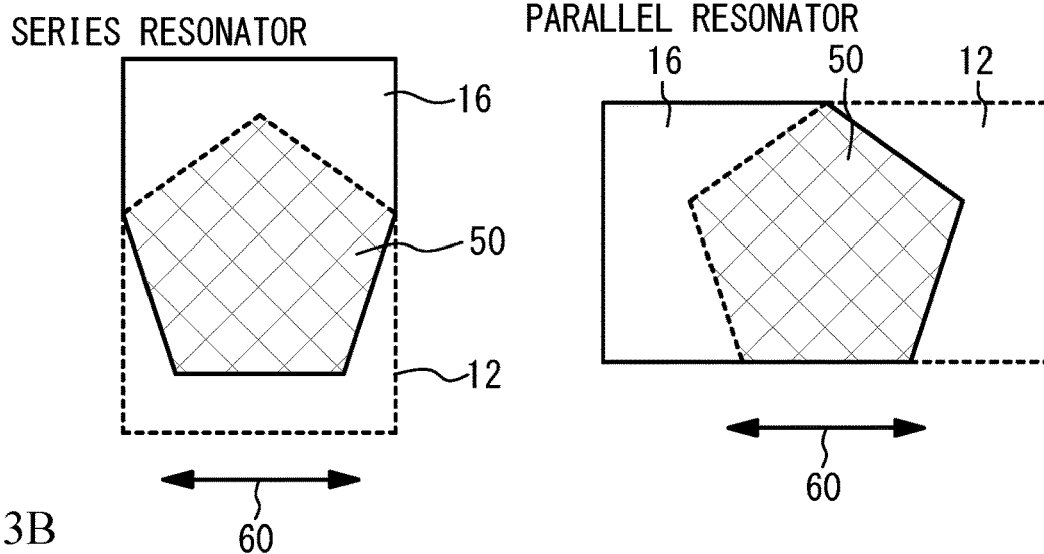
FIG. 13A to FIG. 13C are plan views illustrating another example of a resonance region.
Figure 13B:
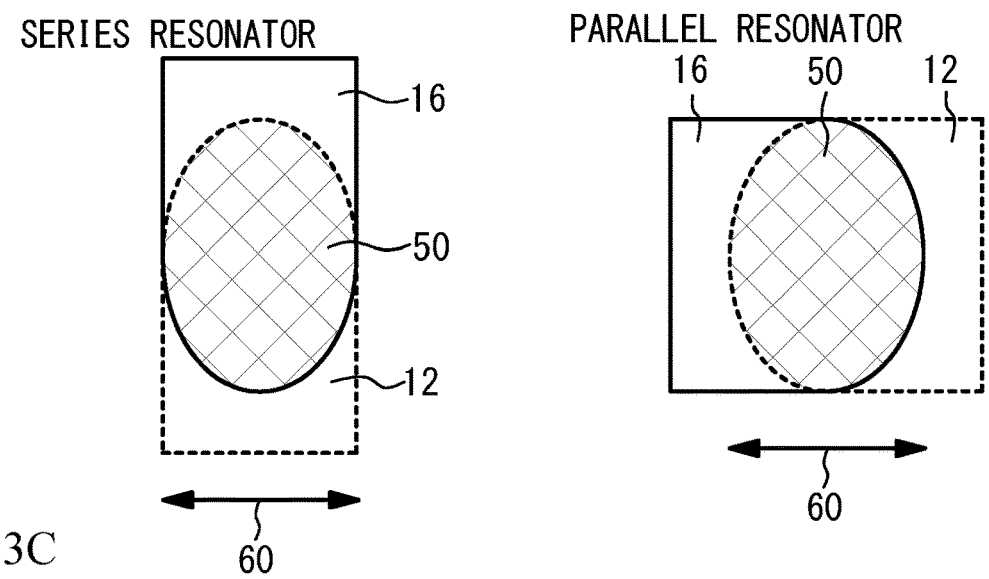
Figure 13C:
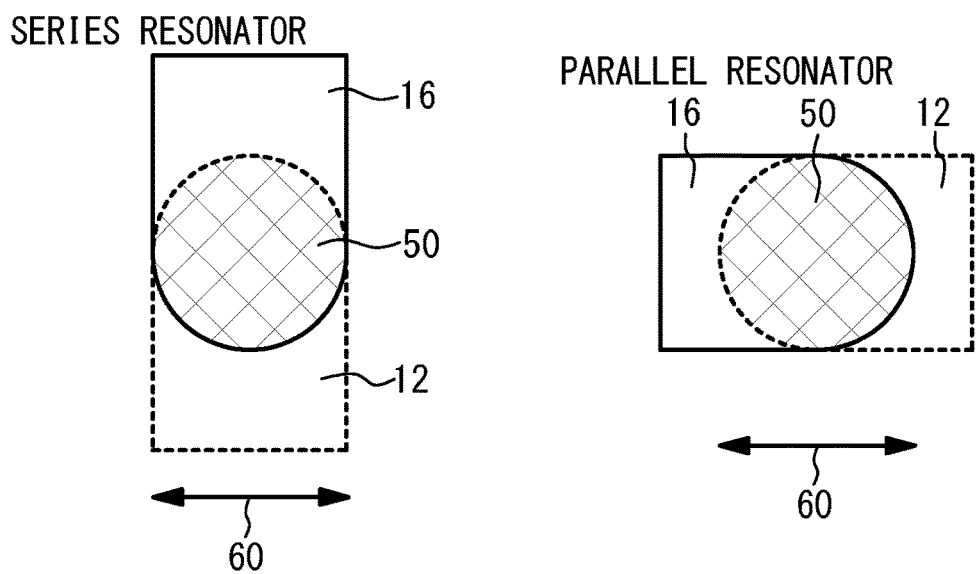

The case that the planar shape of the resonance region 50 is a substantially rectangular shape has been described, but the planar shape of the resonance region 50 may be other shapes. FIG. 13A to FIG. 13C are plan views illustrating other examples of the resonance region 50. In FIG. 13A to FIG. 13C, the vibration direction 60 of the thickness-shear vibration is indicated by an arrow, the piezoelectric thin film resonator used for the series resonator is illustrated in the left part, and the piezoelectric thin film resonator used for the parallel resonator is illustrated in the right part. As illustrated in FIG. 13A, the planar shape of the resonance region 50 may be a substantially polygonal shape such as a substantially pentagonal shape. As illustrated in FIG. 13B, the planar shape of the resonance region 50 may be a substantially elliptical shape. As illustrated in FIG. 13C, the planar shape of the resonance region 50 may be a substantially circular shape.

Figure 14A:
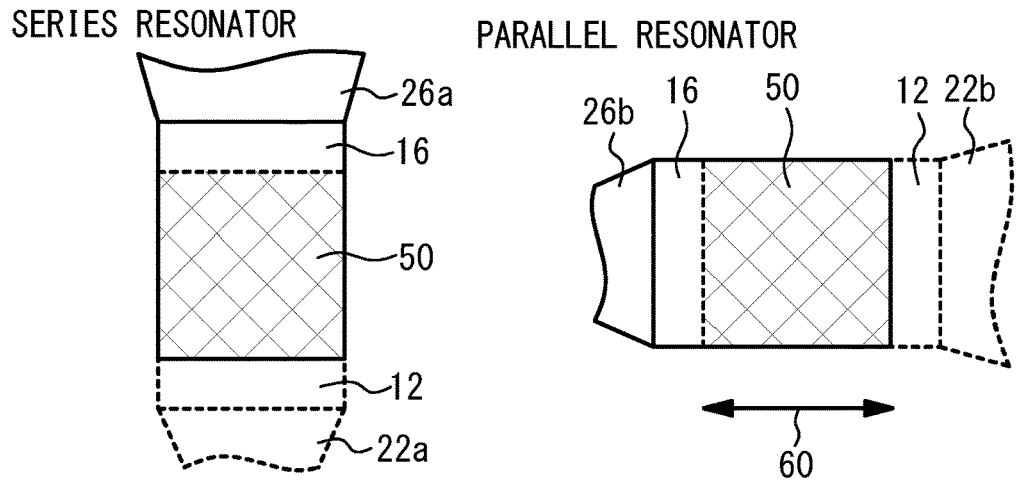
FIG. 14A to FIG. 14C are plan views illustrating examples of a lower wiring line and an upper wiring line.
Figure 14B:
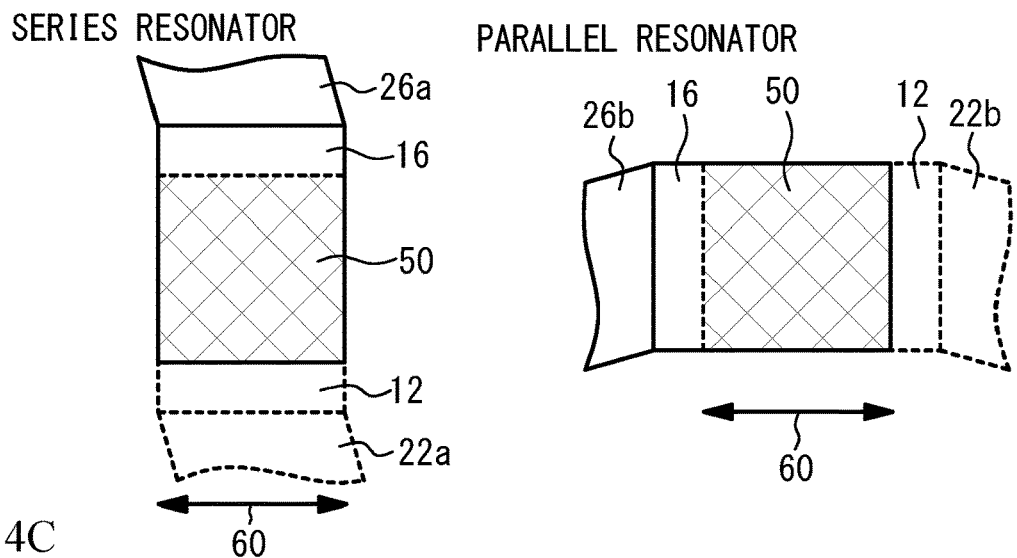
Figure 14C:
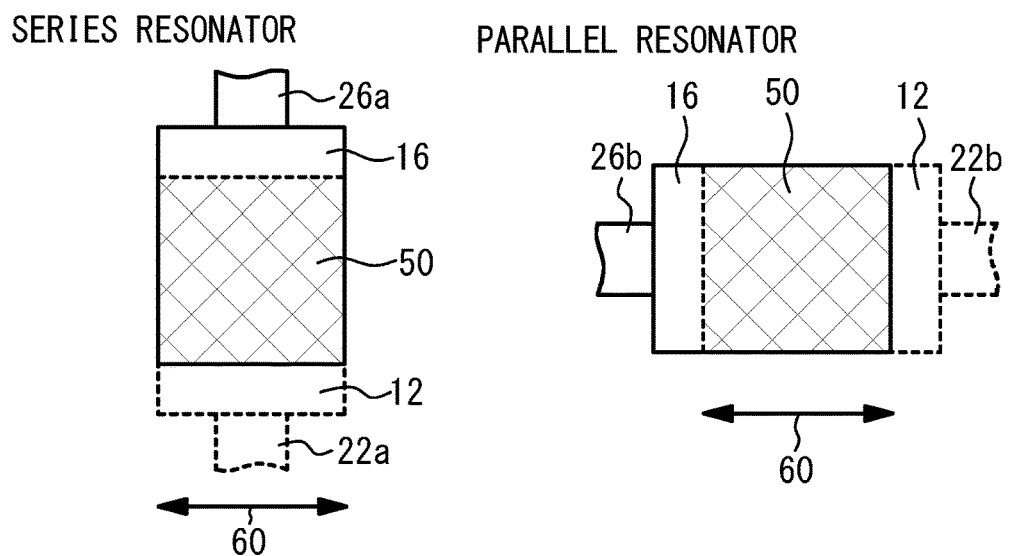

FIG. 14A to FIG. 14C are plan views illustrating examples of the lower wiring lines 22a and 22b and the upper wiring lines 26a and 26b. In FIG. 14A to FIG. 14C, the vibration direction 60 of the thickness-shear vibration is indicated by an arrow, the piezoelectric thin film resonator used for the series resonator is illustrated in the left part, and the piezoelectric thin film resonator used for the parallel resonator is illustrated in the right part. As illustrated in FIG. 14A, the lower wiring line 22a coupled to the lower electrode 12 of the series resonator, the upper wiring line 26a coupled to the upper electrode 16 of the series resonator, or both of them may have a width that increases or decreases at farther distances from the lower electrode 12, the upper electrode 16, or the respective electrodes. Similarly, the lower wiring line 22b coupled to the lower electrode 12 of the parallel resonator, the upper wiring line 26b coupled to the upper electrode 16 of the parallel resonator, or both of them may have a width that increases or decreases at farther distances from the lower electrode 12, the upper electrode 16, or the respective electrodes.

As illustrated in FIG. 14B, the lower wiring line 22a coupled to the lower electrode 12 of the series resonator, the upper wiring line 26a coupled to the upper electrode 16 of the series resonator, or both of them may be extracted from the lower electrode 12, the upper electrode 16, or the respective electrodes in the direction intersecting with the direction in which the lower electrode 12 and the upper electrode 16 are extracted from the resonance region 50. Similarly, the lower wiring line 22b coupled to the lower electrode 12 of the parallel resonator, the upper wiring line 26b coupled to the upper electrode 16 of the parallel resonator, or both of them may be extracted from the lower electrode 12, the upper electrode 16, or the respective electrodes in the direction intersecting with the direction in which the lower electrode 12 and the upper electrode 16 are extracted from the resonance region 50.

As illustrated in FIG. 14C, the lower wiring line 22a coupled to the lower electrode 12 of the series resonator, the upper wiring line 26a coupled to the upper electrode 16 of the series resonator, or both of them may be extracted from the lower electrode 12, the upper electrode 16, or the respective electrodes at a constant width narrower than those of the lower electrode 12 and the upper electrode 16. Similarly, the lower wiring line 22b coupled to the lower electrode 12 of the parallel resonator, the upper wiring line 26b coupled to the upper electrode 16 of the parallel resonator, or both of them may be extracted from the lower electrode 12, the upper electrode 16, or the respective electrodes at a constant width narrower than those of the lower electrode 12 and the upper electrode 16.

By configuring the lower wiring lines 22a and 22b and the upper wiring lines 26a and 26b to be as illustrated in FIG. 14A to FIG. 14C, the degree of freedom of the routing of the wiring lines improves, and the input terminal Tin, the output terminal Tout, and the ground terminals Tg can be arranged in appropriate positions.

The first embodiment has described the case that the piezoelectric layer 14 is a monocrystalline lithium niobate layer, as an example, but this does not intend to suggest any limitation. The piezoelectric layer 14 may be a monocrystalline lithium tantalate layer. Even in the case in which the piezoelectric layer 14 is a monocrystalline lithium tantalate layer, the vibration direction 60 of the thickness-shear vibration becomes the same when the crystal orientations are configured to be the same as those in the case in which the piezoelectric layer is a monocrystalline lithium niobate layer. That is, even in the case in which the piezoelectric layer 14 is a monocrystalline lithium tantalate layer, the X direction is the vibration direction 60 of the thickness-shear vibration when the Euler angles are (90°, 105°, 0°) as in FIG. 3A and FIG. 3C. As in FIG. 4A and FIG. 4B, when the Euler angles are (0°, 105°, 0°), the Y direction is the vibration direction 60 of the thickness-shear vibration.

Therefore, even in the case in which the piezoelectric layer 14 is a monocrystalline lithium tantalate layer, when the X-axis orientation of the crystal orientations is a planar direction and the thickness direction is a direction obtained by rotating the +Z-axis orientation of the crystal orientations substantially 105° toward the +Y-axis orientation, the vibration direction 60 of the thickness-shear vibration is a direction orthogonal to the X-axis orientation of the crystal orientations of the piezoelectric layer 14. Therefore, even in the case in which the piezoelectric layer 14 is a monocrystalline lithium tantalate layer, the lower electrode 12 and the upper electrode 16 (a pair of first electrodes) of each of the series resonators S1 to S4 are extracted from the corresponding resonance region 50 in the direction parallel to the X-axis orientation of the crystal orientations of the piezoelectric layer 14, as in the case in which the piezoelectric layer 14 is a monocrystalline lithium niobate layer. The lower electrode 12 and the upper electrode 16 (a pair of second electrodes) of each of the parallel resonators P1 to P3 are extracted from the corresponding resonance region 50 in a direction orthogonal to the X-axis orientation of the crystal orientations of the piezoelectric layer 14. This configuration increases the Q factors at the resonant frequency of the series resonators S1 to S4 and the Q factors at the antiresonant frequency of the parallel resonators P1 to P3. Thus, the transmission characteristics of the filter can be improved. Since lithium tantalate and lithium niobate have the same crystal structure, it is considered that even in the case in which a lithium tantalate layer is used for the piezoelectric layer 14, the same effect as when a lithium niobate layer is used can be obtained.

Second Embodiment

A second embodiment will describe the case that the piezoelectric layer 14 is a monocrystalline lithium tantalate layer having crystal orientations different from those of the first embodiment. The plan view and the cross-sectional view of a filter in accordance with the second embodiment are the same as those of the first embodiment illustrated in FIG. 9A and FIG. 9B, and the description thereof is thus omitted.

Figure 15A:
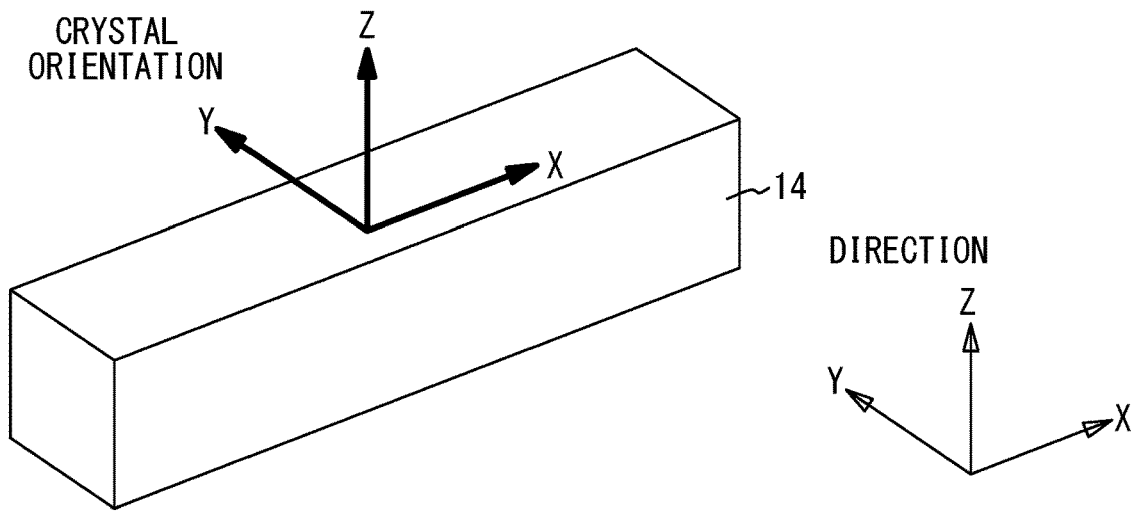
FIG. 15A to FIG. 15C are perspective views illustrating the crystal orientations of the piezoelectric layer in the case that the piezoelectric layer is a monocrystalline lithium tantalate layer.
Figure 15B:
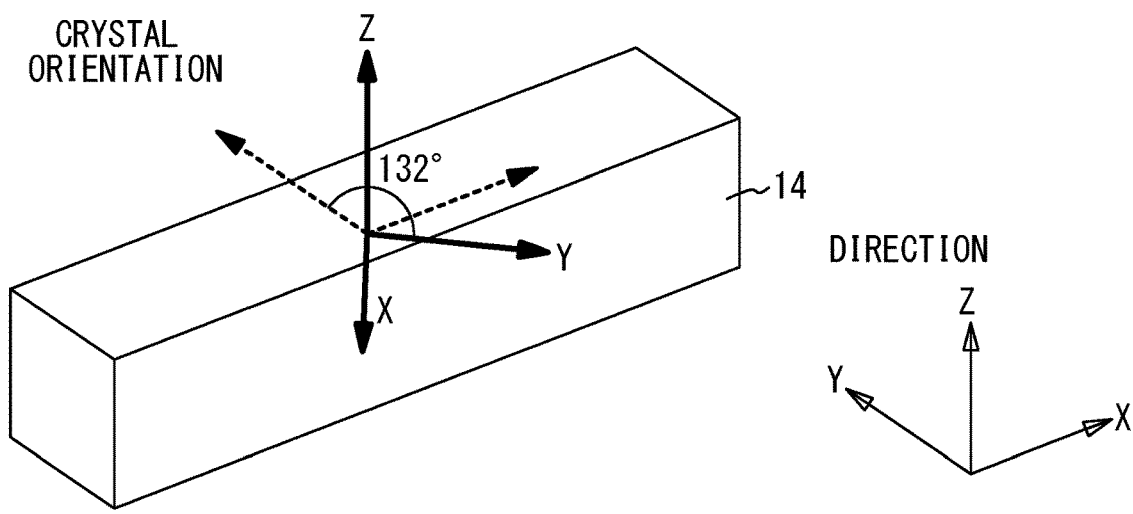
Figure 15C:
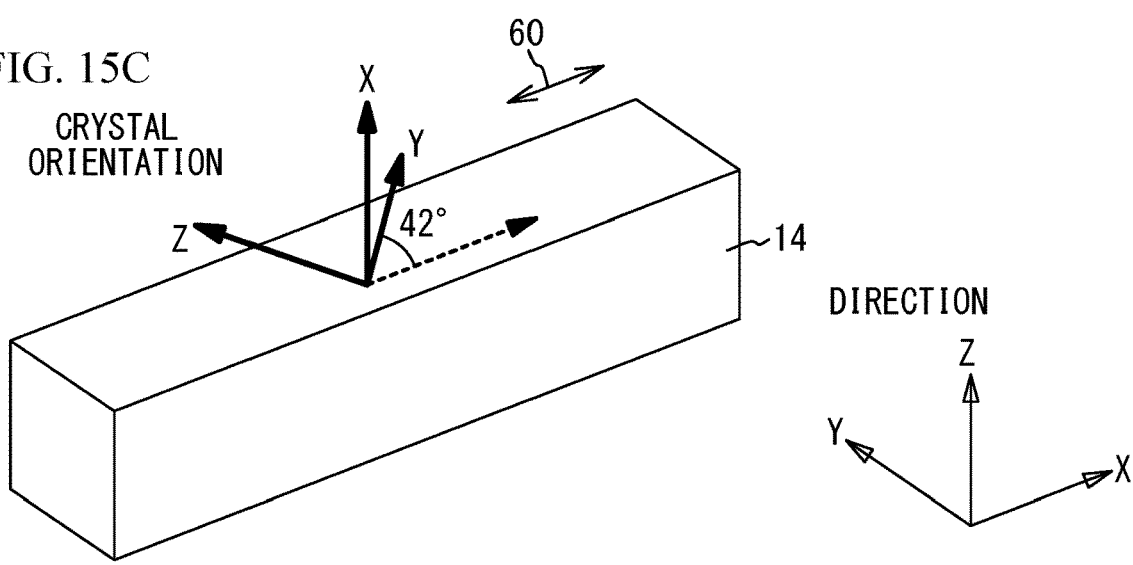

FIG. 15A to FIG. 15C are perspective views illustrating the crystal orientations of the piezoelectric layer 14 in the case that the piezoelectric layer 14 is a monocrystalline lithium tantalate layer. FIG. 15C shows the actual crystal orientation of the piezoelectric layer 14 with respect to the XYZ coordinate system depicted in the drawing in this embodiment, and FIGS. 15A-15B are provided for explaining the actual orientation of FIG. 15C. As illustrated in FIG. 15A, the +X direction, the +Y direction, and the +Z direction are made to correspond to the +X-axis orientation, the +Y-axis orientation, and the +Z-axis orientation of the crystal orientations of the piezoelectric layer 14, respectively. As illustrated in FIG. 15B, from the state of FIG. 15A, the +X-axis orientation and the +Y-axis orientation are rotated 132° in the X-axis-Y-axis plane about the Z-axis orientation from the +X-axis orientation to the −Y-axis orientation. Then, as illustrated in FIG. 15C, the +Y-axis orientation and the +Z-axis orientation are rotated 90° about the X-axis orientation from the +Y-axis orientation to the +Z-axis orientation, and thereafter, the +X-axis orientation and the +Y-axis orientation are rotated 90° about the Z-axis orientation from the +X-axis orientation to the +Y-axis orientation. In the case that the crystal orientations of the piezoelectric layer 14 have been rotated as described above, the +Z direction corresponds to the +X-axis orientation, and the +X direction corresponds to the direction obtained by rotating the +Y-axis orientation 42° toward the −Z-axis orientation. In this case, the X direction corresponds to the vibration direction 60 of the thickness-shear vibration. That is, the direction obtained by rotating the +Y-axis orientation of the crystal orientations of the piezoelectric layer 14 by 42° toward the −Z-axis orientation corresponds to the vibration direction 60 of the thickness-shear vibration. The crystal orientations of the piezoelectric layer 14 are (−132°, 90°, 90°) in Euler angles.

Figure 16A:
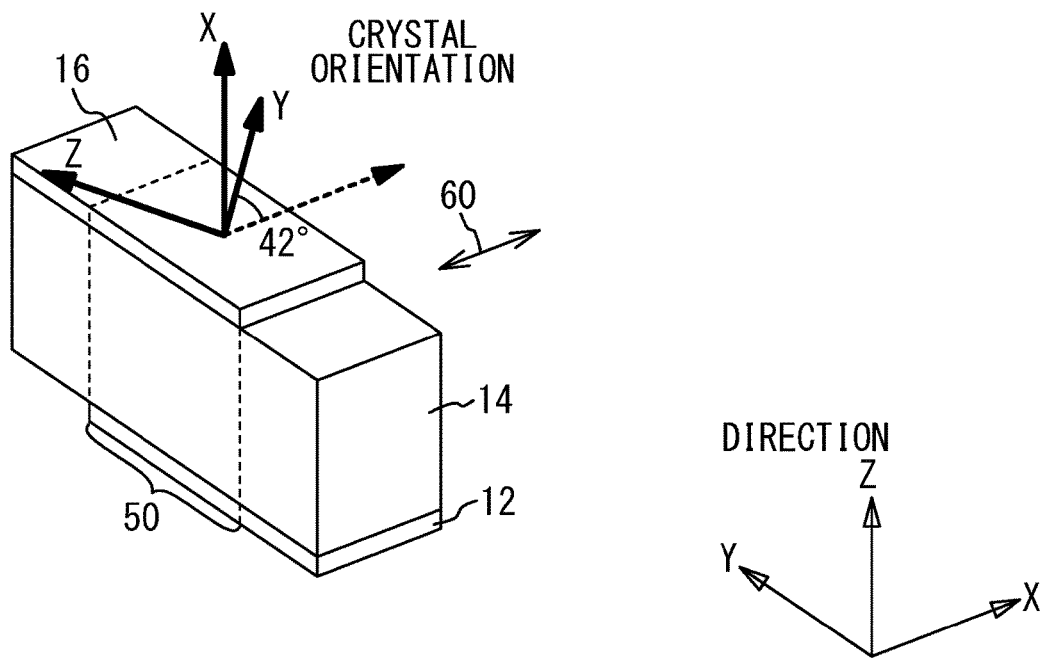
FIG. 16A is a perspective view of a series resonator in a filter in accordance with a second embodiment, and FIG.
Figure 16B:
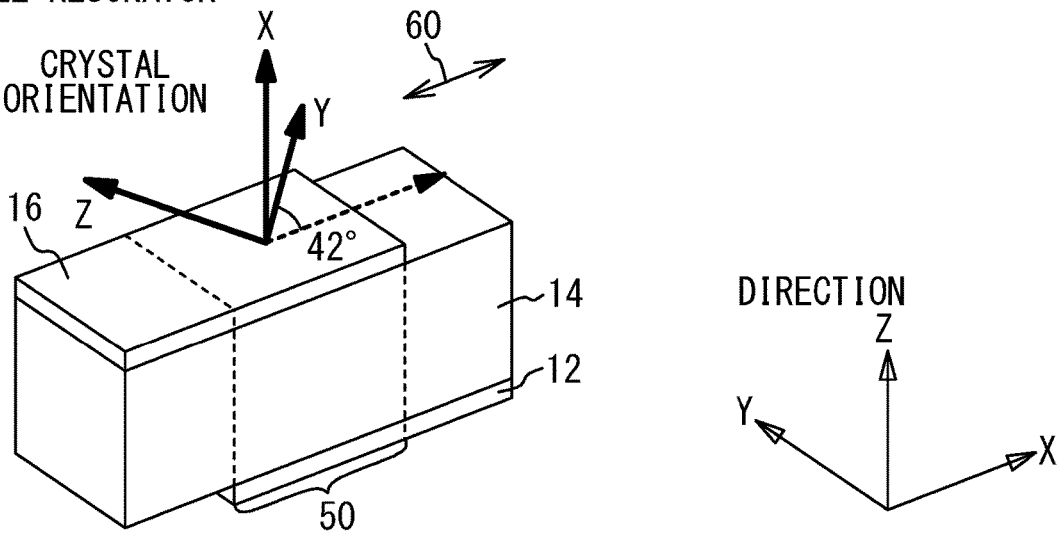

FIG. 16A is a perspective view of a series resonator in the filter in accordance with the second embodiment, and FIG. 16B is a perspective view of a parallel resonator in the filter in accordance with the second embodiment. As illustrated in FIG. 16A and FIG. 16B, the vibration direction 60 of the thickness-shear vibration corresponds to the direction obtained by rotating the +Y-axis orientation of the crystal orientations of the piezoelectric layer 14 substantially 42° toward the −Z-axis orientation, and corresponds to substantially the X direction. For example, the crystal orientations of the piezoelectric layer 14 are (−132°±5°, 90°±5°, 90°±5°) in Euler angles.

As illustrated in FIG. 16A, the lower electrode 12 and the upper electrode 16 of each of the series resonators S1 to S4 are extracted from the corresponding resonance region 50 in a substantially orthogonal direction to the direction obtained by rotating the +Y-axis orientation of the crystal orientations of the piezoelectric layer 14 substantially 42° to the −Z-axis orientation (e.g., the Y direction). In other words, the lower electrode 12 and the upper electrode 16 of each of the series resonators S1 to S4 are extracted from the resonance region 50 in a substantially orthogonal direction to the vibration direction 60 of the thickness-shear vibration. As illustrated in FIG. 16B, the lower electrode 12 and the upper electrode 16 of each of the parallel resonators P1 to P3 are extracted from the corresponding resonance region 50 in substantially the same direction as the direction obtained by rotating the +Y-axis orientation of the crystal orientations of the piezoelectric layer 14 substantially 42° toward the Z-axis orientation (e.g., the X direction). In other words, the lower electrode 12 and the upper electrode 16 of each of the parallel resonators P1 to P3 are extracted from the corresponding resonance region 50 in substantially the same direction as the vibration direction 60 of the thickness-shear vibration.

In the second embodiment, as illustrated in FIG. 16A and FIG. 16B, the piezoelectric layer 14 is a monocrystalline lithium tantalate layer, the X-axis orientation of the crystal orientations of the piezoelectric layer 14 corresponds to the thickness direction of the piezoelectric layer 14, and the Y-axis orientation and the Z-axis orientation of the crystal orientations correspond to the planar directions. In this case, the vibration direction 60 of the thickness-shear vibration is the direction obtained by rotating the +Y-axis orientation of the crystal orientations of the piezoelectric layer 14 substantially 42° toward the −Z-axis orientation. The term "substantially 42°" used in the description "the direction obtained by rotating the +Y-axis orientation of the crystal orientations of the piezoelectric layer 14 substantially 42° toward the −Z-axis orientation" is an angle within a range of 42°±5°, preferably an angle within a range of 42°±3°, more preferably an angle within a range of 42°±1°. As illustrated in FIG. 16A, the lower electrode 12 and the upper electrode 16 (a pair of first electrodes) of each of the series resonators S1 to S4 are extracted from the corresponding resonance region 50 in a substantially orthogonal direction to the direction obtained by rotating the +Y-axis orientation of the crystal orientations of the piezoelectric layer 14 by 42° toward the −Z-axis orientation. As illustrated in FIG. 16B, the lower electrode 12 and the upper electrode 16 (a pair of second electrodes) of each of the parallel resonators P1 to P3 are extracted from the corresponding resonance region 50 in substantially the same direction as the direction obtained by rotating the +Y-axis orientation of the crystal orientations of the piezoelectric layer 14 substantially 42° toward the −Z-axis orientation. As in the case of lithium niobate described above, this structure allows the Q factors at the resonant frequency of the series resonators S1 to S4 and the Q factors at the antiresonant frequency of the parallel resonators P1 to P3 to be large, thereby improving the transmission characteristics of the filter. This is because, since lithium tantalate and lithium niobate described above have the same crystal structure, as far as the behavior of the Q factors of the device is concerned, it is considered that even when a lithium tantalate layer is used for the piezoelectric layer 14, the same result as when a lithium niobate layer is used is obtained for the Q factor behavior of the device. The substantially orthogonal direction to the direction obtained by rotating the +Y-axis orientation of the crystal orientations of the piezoelectric layer 14 by 42° toward the −Z-axis orientation is the direction at an angle within a range of ±5° from the orthogonal direction to the direction obtained by a rotation of 42°, preferably the direction at an angle within a range of ±3° from the orthogonal direction to the direction obtained by a rotation of 42°, more preferably the direction at an angle within a range of ±1° from the orthogonal direction to the direction obtained by a rotation of 42°. Similarly, substantially the same direction as the direction obtained by rotating the +Y-axis orientation of the crystal orientations of the piezoelectric layer 14 by 42° toward the −Z-axis orientation is the direction at an angle within a range of ±5° from the direction obtained by a rotation of 42°, the direction at an angle within a range of ±3° from the direction obtained by a rotation of 42°, more preferably the direction at an angle within a range of ±1° from the direction obtained by a rotation of 42°.

Also in the second embodiment, the series resonators S1 to S4 may be arranged side by side in a substantially orthogonal direction to the vibration direction 60 of the thickness-shear vibration as illustrated in FIG. 9A of the first embodiment, or the series resonators S1 to S4 are arranged side by side in substantially the same direction as the vibration direction 60 of the thickness-shear vibration as illustrated in FIG. 11 of the variation of the first embodiment. In addition, in the second embodiment, the series resonators S1 to S4 and the parallel resonators P1 to P3 may be SMRs, or may be FBARs.

In addition, in the first embodiment, the variation of the first embodiment, and the second embodiment, the lower electrode 12 and the upper electrode 16 of each of the series resonators S1 to S4 are extracted from the corresponding resonance region 50 in a substantially orthogonal direction to the vibration direction 60 of the thickness-shear vibration excited in the piezoelectric layer 14. The lower electrode 12 and the upper electrode 16 of each of the parallel resonators P1 to P3 are extracted from the corresponding resonance region 50 in substantially the same direction as the vibration direction 60 of the thickness-shear vibration excited in the piezoelectric layer 14. This increases the Q factors at the resonant frequency of the series resonators S1 to S4, and increases the Q factors at the antiresonant frequency of the parallel resonators P1 to P3, thereby improving the transmission characteristics of the filter. The substantially orthogonal direction to the vibration direction 60 of the thickness-shear vibration is the direction at an angle within a range of ±5° from the vibration direction 60 of the thickness-shear vibration, the direction at an angle within a range of ±3° from the vibration direction 60 of the thickness-shear vibration, more preferably the direction at an angle within a range of ±1° from the vibration direction 60 of the thickness-shear vibration. Similarly, substantially the same direction as the vibration direction 60 of the thickness-shear vibration is the direction at an angle within a range of ±5° from the vibration direction 60 of the thickness-shear vibration, preferably the direction at an angle within a range of ±3° from the vibration direction 60 of the thickness-shear vibration, more preferably the direction at an angle within a range of ±1° from the vibration direction 60 of the thickness-shear vibration.

In the first embodiment, the variation of the first embodiment, and the second embodiment, the case that the lower electrode 12 and the upper electrode 16 are extracted from the corresponding resonance region 50 in a substantially orthogonal direction to the vibration direction 60 of the thickness-shear vibration in all the series resonators S1 to S4 has been described as an example. However, this does not intend to suggest any limitation, and the lower electrode 12 and the upper electrode 16 may be extracted from the resonance region 50 in a substantially orthogonal direction to the vibration direction 60 of the thickness-shear vibration in at least one of the series resonators S1 to S4. Similarly, the case that the lower electrode 12 and the upper electrode 16 are extracted from the corresponding resonance region 50 in substantially the same direction as the vibration direction 60 of the thickness-shear vibration in all the parallel resonators P1 to P3 has been described as an example. However, this does not intend to suggest any limitation, and the lower electrode 12 and the upper electrode 16 may be extracted from the corresponding resonance region 50 in substantially the same direction as the vibration direction 60 of the thickness-shear vibration in at least one of the parallel resonators P1 to P3.

Third Embodiment

Figure 17:
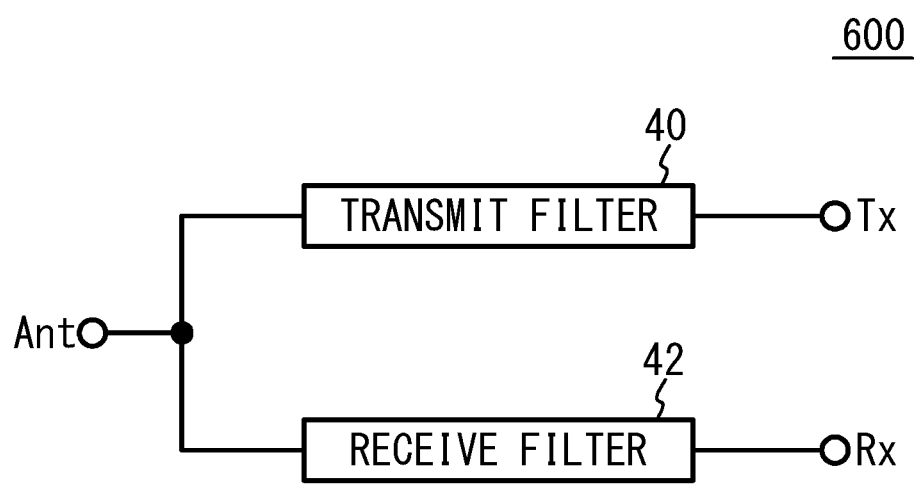
FIG. 17 is a block diagram of a duplexer in accordance with a third embodiment.

FIG. 17 is a block diagram of a duplexer 600 in accordance with a third embodiment. As illustrated in FIG. 17, in the duplexer 600, a transmit filter 40 is connected between a common terminal Ant and a transmit terminal Tx, and a receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. The transmit filter 40, the receive filter 42, or both of them may be the filter according to any one of the first embodiment, the variation of the first embodiment, and the second embodiment. A duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A filter comprising:
   a substrate;
   a series resonator that is disposed on the substrate, is connected in series between an input terminal and an output terminal, and includes a first piezoelectric layer and a pair of first electrodes, the first piezoelectric layer being a monocrystalline lithium niobate layer or a monocrystalline lithium tantalate layer, an X-axis orientation of crystal orientations of the first piezoelectric layer corresponding to a planar direction, a thickness direction of the first piezoelectric layer corresponding to a direction obtained by rotating a +Z-axis orientation of the crystal orientations of the first piezoelectric layer substantially 105° toward the +Y-axis orientation, the pair of first electrodes being opposite to each other across the first piezoelectric layer to form a first resonance region, each of the pair of first electrodes being extracted from the first resonance region in a direction that is substantially parallel to the X-axis orientation of the crystal orientations of the first piezoelectric layer; and
   a parallel resonator that is disposed on the substrate, is connected in parallel between the input terminal and the output terminal, and includes a second piezoelectric layer and a pair of second electrodes, the second piezoelectric layer being a monocrystalline lithium niobate layer or a monocrystalline lithium tantalate layer, an X-axis orientation of crystal orientations of the second piezoelectric layer corresponding to a planar direction, a thickness direction of the second piezoelectric layer corresponding to a direction obtained by rotating a +Z-axis orientation of the crystal orientations of the second piezoelectric layer substantially 105° toward a +Y-axis orientation of the crystal orientations of the second piezoelectric layer, the pair of second electrodes being opposite to each other across the second piezoelectric layer to form a second resonance region, each of the pair of second electrodes being extracted from the second resonance region in a direction that is substantially orthogonal to the X-axis orientation of the crystal orientations of the second piezoelectric layer.

2. The filter according to claim 1,
wherein each of the pair of first electrodes is linearly extracted from the first resonance region in said direction by a length equal to or greater than 0.75 times a thickness of the first piezoelectric layer in the first resonance region, and
wherein each of the pair of second electrodes is linearly extracted from the second resonance region in said direction by a length equal to or greater than 0.75 times a thickness of the second piezoelectric layer in the second resonance region.

3. The filter according to claim 2, further comprising:
a first wiring line coupled to an end opposite from the first resonance region of one of the pair of first electrodes; and
a second wiring line coupled to an end opposite from the second resonance region of one of the pair of second electrodes,
wherein a width of the first wiring line varies with distance from the one of the pair of first electrodes and/or a width of the second wiring line varies with distance from the one of the pair of second electrodes.

4. The filter according to claim 3,
wherein the series resonator is provided in a plurality, connected in series between the input terminal and the output terminal by a plurality of the first wiring lines, and the plurality of the series resonators are arranged such that the crystal orientations of the first piezoelectric layers of the plurality of the series resonator are the same,
wherein the plurality of series resonators are arranged side by side substantially in parallel with a direction parallel to the X-axis orientation of the crystal orientations of the first piezoelectric layer, and
wherein a first series resonator of the plurality of series resonators is coupled to the input terminal by one of the plurality of first wiring lines a width of which increases with distance from the one of the pair of first electrodes to which the first wiring line is coupled, and a last series resonator of the plurality of series resonators is coupled to the output terminal by another one of the plurality of first wiring lines a width of which increases with distance from the one of the pair of first electrodes to which the first wiring line is coupled.

5. The filter according to claim 3, wherein the parallel resonator is coupled to the first wiring line by the second wiring line a width of which decreases with distance from the pair of second electrodes.

6. The filter according to claim 2, further comprising:
a first wiring line coupled to an end opposite from the first resonance region of one of the pair of first electrodes; and
a second wiring line coupled to an end opposite from the second resonance region of one of the pair of second electrodes,
wherein the first wiring line extends from the one of the pair of first electrodes in a direction intersecting with the direction in which the one of the pair of first electrodes is extracted from the first resonance region, and/or the second wiring line extends from the one of the pair of second electrodes in a direction intersecting with the direction in which the one of the pair of second electrodes is extracted from the second resonance region.

7. The filter according to claim 6,
wherein the series resonator is provided in a plurality, connected in series between the input terminal and the output terminal by a plurality of the first wiring lines, and the plurality of the series resonators are arranged such that the crystal orientations of the first piezoelectric layers of the plurality of the series resonator are the same,
wherein the plurality of series resonators are arranged side by side substantially in parallel with a direction orthogonal to the X-axis orientation of the crystal orientations of the first piezoelectric layer,
wherein a first series resonator of the plurality of series resonators is coupled to the input terminal by one of the plurality of the first wiring line that extends from the one of the pair of first electrodes in a direction intersecting with the direction in which the one of the pair of first electrodes is extracted from the first resonance region in the first series resonator, and a last series resonator of the series resonators is coupled to the output terminal by another one of the plurality of the first wiring line that extends from the one of the pair of first electrodes in a direction intersecting with the direction in which the one of the pair of first electrodes is extracted from the first resonance region in the last series resonator, and
wherein the parallel resonator is coupled to a ground terminal by the second wiring line that extends from the one of the pair of second electrodes in a direction intersecting with the direction in which the one of the pair of second electrodes is extracted from the second resonance region.

8. The filter according to claim 1, wherein the first piezoelectric layer and the second piezoelectric layer are formed of a single continuous piezoelectric layer.

9. A multiplexer comprising:
the filter according to claim 1.

10. A filter comprising:
a substrate;
a series resonator that is disposed on the substrate, is connected in series between an input terminal and an output terminal, and includes a first piezoelectric layer and a pair of first electrodes, the first piezoelectric layer being a monocrystalline lithium tantalate layer, an X-axis orientation of crystal orientations of the first piezoelectric layer corresponding to a thickness direction of the first piezoelectric layer, a Y-axis orientation and a Z-axis orientation of the crystal orientations of the first piezoelectric layer corresponding to planar directions, the pair of first electrodes being opposite to each other across the first piezoelectric layer to form a first resonance region, each of the pair of first electrodes being extracted from the first resonance region in a direction that is substantially orthogonal to a direction obtained by rotating the +Y-axis orientation of the crystal orientations of the first piezoelectric layer 42° toward the −Z-axis orientation; and a parallel resonator that is disposed on the substrate, is connected in parallel between the input terminal and the output terminal, and includes a second piezoelectric layer and a pair of second electrodes, the second piezoelectric layer being a monocrystalline lithium tantalate layer, an X-axis orientation of crystal orientations of the second piezoelectric layer corresponding to a thickness direction of the second piezoelectric layer, a Y-axis orientation and a Z-axis orientation of the crystal orientations of the second piezoelectric layer corresponding to planar directions, the pair of second electrodes being opposite to each other across the second piezoelectric layer to form a second resonance region, each of the pair of second electrodes being extracted from the second resonance region in a direction that is substantially parallel to a direction obtained by rotating the +Y-axis orientation of the crystal orientations of the second piezoelectric layer 42° toward the −Z-axis orientation of the crystal orientations of the second piezoelectric layer.

11. The filter according to claim 10,
wherein each of the pair of first electrodes is linearly extracted from the first resonance region in said direction by a length equal to or greater than 0.75 times a thickness of the first piezoelectric layer in the first resonance region, and
wherein each of the pair of second electrodes is linearly extracted from the second resonance region in said direction by a length equal to or greater than 0.75 times a thickness of the second piezoelectric layer in the second resonance region.

12. A multiplexer comprising:
the filter according to claim 10.

13. The filter according to claim 10, wherein the first piezoelectric layer and the second piezoelectric layer are formed of a single continuous piezoelectric layer.

14. A filter comprising:
a substrate;
a series resonator that is disposed on the substrate, is connected in series between an input terminal and an output terminal, and includes a first piezoelectric layer and a pair of first electrodes, the pair of first electrodes being opposite to each other across the first piezoelectric layer to form a first resonance region, the pair of first electrodes exciting thickness-shear vibration in the first piezoelectric layer, each of the pair of first electrodes being extracted from the first resonance region in a direction that is substantially orthogonal to a vibration direction of the thickness-shear vibration excited in the first piezoelectric layer; and a parallel resonator that is disposed on the substrate, is connected between the input terminal and the output terminal, and includes a second piezoelectric layer and a pair of second electrodes, the pair of second electrodes being opposite to each other across the second piezoelectric layer to form a second resonance region, the pair of second electrodes exciting thickness-shear vibration in the second piezoelectric layer, each of the pair of second electrodes being extracted from the second resonance region in a direction that is substantially parallel to a vibration direction of the thickness-shear vibration excited in the second piezoelectric layer.

15. The filter according to claim 14,
wherein each of the pair of first electrodes is linearly extracted from the first resonance region in said direction by a length equal to or greater than 0.75 times a thickness of the first piezoelectric layer in the first resonance region, and
wherein each of the pair of second electrodes is linearly extracted from the second resonance region in said direction by a length equal to or greater than 0.75 times a thickness of the second piezoelectric layer in the second resonance region.

16. The filter according to claim 14, wherein the first piezoelectric layer and the second piezoelectric layer are formed of a single continuous piezoelectric layer.

17. A multiplexer comprising:
the filter according to claim 14.

* * * * *